US012580590B2

(12) United States Patent
Kim et al.

(10) Patent No.: US 12,580,590 B2
(45) Date of Patent: Mar. 17, 2026

(54) COLUMN REDUNDANCY CIRCUIT AND MEMORY DEVICE INCLUDING SAME

(71) Applicant: SAMSUNG ELECTRONICS CO., LTD., Suwon-si (KR)

(72) Inventors: Kiryong Kim, Suwon-si (KR); Inhak Lee, Suwon-si (KR); Jaesung Choi, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 18/764,731

(22) Filed: Jul. 5, 2024

(65) Prior Publication Data

US 2025/0167805 A1     May 22, 2025

(30) Foreign Application Priority Data

Nov. 22, 2023    (KR) ........................ 10-2023-0162925

(51) Int. Cl.
    *H03M 13/00*       (2006.01)
    *H03M 13/09*       (2006.01)

(52) U.S. Cl.
    CPC ......... *H03M 13/09* (2013.01); *H03M 13/611* (2013.01)

(58) Field of Classification Search
    CPC ............................ H03M 13/09; H03M 13/611
    See application file for complete search history.

(56) References Cited

U.S. PATENT DOCUMENTS

| | | | |
|---|---|---|---|
| 6,115,301 A | 9/2000 | Namekawa | |
| 6,421,284 B1 * | 7/2002 | Sakata | ................. G11C 29/785 365/200 |

| | | | |
|---|---|---|---|
| 6,741,509 B2 * | 5/2004 | Kato | ...................... G11C 29/26 365/201 |
| 6,930,934 B2 | 8/2005 | Wang | |
| 6,966,012 B1 * | 11/2005 | Gandhi | ............. G11C 29/4401 714/6.32 |

(Continued)

FOREIGN PATENT DOCUMENTS

| | | |
|---|---|---|
| CN | 113114264 | 7/2021 |
| KR | 10-2015-0001133 | 1/2015 |

OTHER PUBLICATIONS

Extended European Search Report in European Appln. No. 24199610.7, mailed on Mar. 12, 2025, 16 pages.

(Continued)

*Primary Examiner* — Esaw T Abraham
(74) *Attorney, Agent, or Firm* — Fish & Richardson P.C.

(57) ABSTRACT

An example column redundancy circuit of a memory device comprises a pre-decoder circuit, a main decoder circuit, and a shift logic circuit. The pre-decoder circuit is configured to receive a lower column address from a plurality of fault column addresses and perform a first decoding operation, and to receive an upper column address from the plurality of fault column address and perform a second decoding operation. The main decoder circuit includes a plurality of main decoders, and each main decoder is configured to receive a lower signal and one or more upper signals from the pre-decoder circuit and to perform a main decoding operation. The shift logic circuit includes a plurality of shift logics, and each shift logic is configured to generate a shift signal that performs a column shift operation according to a result of the main decoding operation.

20 Claims, 28 Drawing Sheets

(56) References Cited

U.S. PATENT DOCUMENTS

| | | | |
|---|---|---|---|
| 7,251,173 B2 * | 7/2007 | Lunde | G11C 29/808 |
| | | | 365/230.06 |
| 7,391,661 B2 * | 6/2008 | Dray | G11C 29/848 |
| | | | 365/158 |
| 7,864,092 B2 | 1/2011 | Chen et al. | |
| 8,427,894 B2 | 4/2013 | Behrends et al. | |
| 8,681,548 B2 * | 3/2014 | Liu | G11C 7/1036 |
| | | | 365/233.11 |
| 9,007,856 B2 * | 4/2015 | Son | G11C 29/04 |
| | | | 365/185.09 |
| 9,076,506 B2 * | 7/2015 | Tsai | G11C 19/00 |
| 9,218,262 B2 | 12/2015 | Wu et al. | |
| 10,811,082 B1 * | 10/2020 | Li | G11C 11/409 |
| 10,984,883 B1 * | 4/2021 | Tungala | G11C 29/44 |
| 11,798,631 B2 * | 10/2023 | Lu | G11C 16/0483 |
| 2004/0114449 A1 | 6/2004 | Ohtani | |
| 2005/0047228 A1 | 3/2005 | Keeth et al. | |
| 2008/0112219 A1 | 5/2008 | Behrends et al. | |
| 2008/0112237 A1 | 5/2008 | Behrends et al. | |
| 2009/0067269 A1 | 3/2009 | Wissel | |
| 2015/0003141 A1 | 1/2015 | Son et al. | |

OTHER PUBLICATIONS

Office Action in European Search Report in European Appln. No.
24199610.7, mailed on Jan. 30, 2026, 7 pages.

* cited by examiner

| OH PD1 (or OH PD2) | |
| --- | --- |
| Input | Output |
| 00 | 0001 |
| 01 | 0010 |
| 10 | 0100 |
| 11 | 1000 |

FIG.6

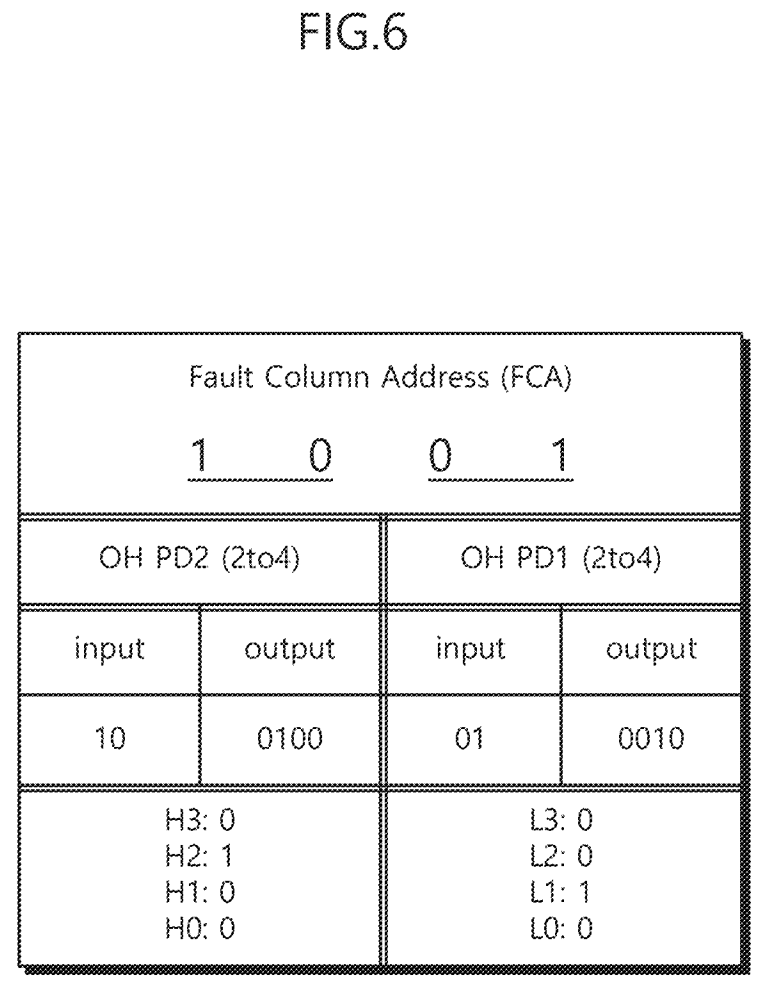

Fault Column Address (FCA)

1   0   0   1

| OH PD2 (2to4) | | OH PD1 (2to4) | |
|---|---|---|---|
| input | output | input | output |
| 10 | 0100 | 01 | 0010 |
| H3: 0 | | L3: 0 | |
| H2: 1 | | L2: 0 | |
| H1: 0 | | L1: 1 | |
| H0: 0 | | L0: 0 | |

| Input<br>(Lx,Hy) | AND | NAND<br>(OHz) |
|---|---|---|
| 00 | 0 | 1 |
| 01 | 0 | 1 |
| 10 | 0 | 1 |
| 11 | 1 | 0 |

OH Main Decoder
(MD01~MD16)

| BTC Pre-decoder (PD1 or PD2) | |
|---|---|
| Input | Output |
| 00 | 0001 |
| 01 | 0011 |
| 10 | 0111 |
| 11 | 1111 |

FIG.15

Fault Column Address (FCA)

1    0    0    1

| | BTC PD2 | | BTC PD1 | |
|---|---|---|---|---|
| | input | output | input | output |
| | 10 | 0111 | 01 | 0011 |
| | *H4: 0 | | L3: 0 | |
| | H3: 0 | | L2: 0 | |
| | H2: 1 | | L1: 1 | |
| | H1: 1 | | *L0: 1 | |
| | *H0: 1 | | | |

| PD1 (OH) | | PD2 (BTC) | |
|---|---|---|---|
| Input | Output | Input | Output |
| 00 | 0001 | 00 | 0001 |
| 01 | 0010 | 01 | 0011 |
| 10 | 0100 | 10 | 0111 |
| 11 | 1000 | 11 | 1111 |

Fault Column Address (FCA)

1　1　0　0　1

| BTC PD2 | | OH PD1 | |
|---|---|---|---|
| input | output | input | output |
| 10 | 0111 | 01 | 0010 |
| H3: 0<br>H2: 1<br>H1: 1<br>H0: 1 | | L3: 0<br>L2: 0<br>L1: 1<br>L0: 0 | |

4200

COLUMN REDUNDANCY CIRCUIT AND MEMORY DEVICE INCLUDING SAME

CROSS-REFERENCE TO RELATED APPLICATION

This application claims priority under 35 U.S.C. § 119 to Korean Patent Application No. 10-2023-0162925 filed on Nov. 22, 2023, in the Korean Intellectual Property Office, the disclosure of which is incorporated by reference herein in its entirety.

BACKGROUND

A semiconductor memory may be mainly classified as a volatile memory or a non-volatile memory. Read and write speeds of the volatile memory (e.g., a DRAM or an SRAM) are fast, but the data stored in the volatile memory disappear when a power is turned off. In contrast, the non-volatile memory may retain data even when the power is turned off.

The volatile memory may include Static Random Access Memory (SRAM), which stores data using latches, or Dynamic Random Access Memory (DRAM), which stores data using capacitors. SRAM is difficult to integrate compared to DRAM, so the capacity provided in the same area is small. However, SRAM operates at high speeds and has advantages such as low power and ease of control. Therefore, SRAM is used in memories that require high-speed access, such as caches.

SRAM may include a plurality of memory cells arranged in rows and columns. Each memory cell may include latches connected to a corresponding word line and a corresponding bit line. A word line pulse may be applied to the word line to select a memory cell during a write or read operation.

When a fault occurs in a random memory cell, the memory device may use a column redundancy circuit to replace the faulty column with a redundancy column. However, the column redundancy circuit may occupy a large area within the memory device, and it may take a lot of setup time to replace a defective column with a redundancy column.

SUMMARY

The present disclosure relates to a column redundancy circuit that may reduce the time required for column redundancy in a small area and a memory device including the same.

In general, according to some aspects, a column redundancy circuit of a memory device comprises, a pre-decoder unit configured to receive a lower column address from among fault column address and perform a first decoding operation, and receive an upper column address from among the fault column address and perform a second decoding operation; a main decoder unit configured to include a plurality of main decoders, each main decoder receiving one lower signal and one or more upper signals from the pre-decoder unit and perform a main decoding operation; and a shift logic unit configured to include a plurality of shift logics, each shift logic generating a shift signal for performing a column shift operation according to a result of the main decoding operation.

In general, according to some aspects, a column redundancy circuit of a memory device comprises, a first pre-decoder configured to receive a lower column address among fault column addresses and perform a OneHot (OH) decoding operation; a second pre-decoder configured to receive an upper column address among the fault column addresses and perform a Binary to Thermometer Code (BTC) decoding operation; a main decoder configured to receive one lower signal from the first pre-decoder, one or more upper signals from the second pre-decoder, and perform a main decoding operation; a shift logic configured to generate a shift signal to perform a column shift operation according to the result of the main decoding operation; and a multiplexer configured to receive the shift signal and perform the column shift operation by selecting one of the bit lines.

In general, according to some aspects, a memory device comprises, a memory cell array including a redundancy cell array and a normal cell array; and a column redundancy circuit connected to the memory cell array through bit lines and controlling access to a memory cell of the redundancy cell array through a column shift operation when a defect occurs in a memory cell of the normal cell array. Wherein the column redundancy circuit includes, a pre-decoder unit configured to receive a lower column address among fault column addresses and perform a first decoding operation, and receive an upper column address among the fault column addresses and perform a second decoding operation; a main decoder unit configured to include a plurality of main decoders, each main decoder receiving one lower signal and one or more upper signals from the pre-decoder unit, and perform a main decoding operation; and a shift logic unit configured to include a plurality of shift logics, each shift logic generating a shift signal for performing the column shift operation according to a result of the main decoding operation.

BRIEF DESCRIPTION OF THE DRAWINGS

The above and other objects and features of the present disclosure will become apparent by describing in detail implementations thereof with reference to the accompanying drawings.

FIG. 1 is a block diagram illustrating an example of a storage device.

FIG. 3 is a block diagram illustrating an example of the column redundancy circuit shown in FIG. 2.

FIGS. 4 to 6 are block diagrams illustrating an example of the pre-decoder unit shown in FIG. 3.

FIGS. 7 to 10 are example block diagrams illustrating the main decoder unit shown in FIG. 3.

FIG. 11 is a circuit diagram illustrating an example of the shift logic unit shown in FIG. 3.

FIG. 12 is a block diagram illustrating an example of the multiplexer unit shown in FIG. 3.

FIGS. 14 and 15 are block diagrams illustrating an example of the pre-decoder unit shown in FIG. 13.

FIG. 19 is a block diagram illustrating an example of the multiplexer unit shown in FIG. 13.

FIG. 20 is a block diagram illustrating another example of the column redundancy circuit shown in FIG. 2.

FIGS. 21 to 24 are block diagrams illustrating an example of the pre-decoder unit shown in FIG. 20.

DETAILED DESCRIPTION

Below, example implementations of the present disclosure will be described in detail and clearly to such an extent that an ordinary one in the art easily implements the described concepts.

Figure 1:
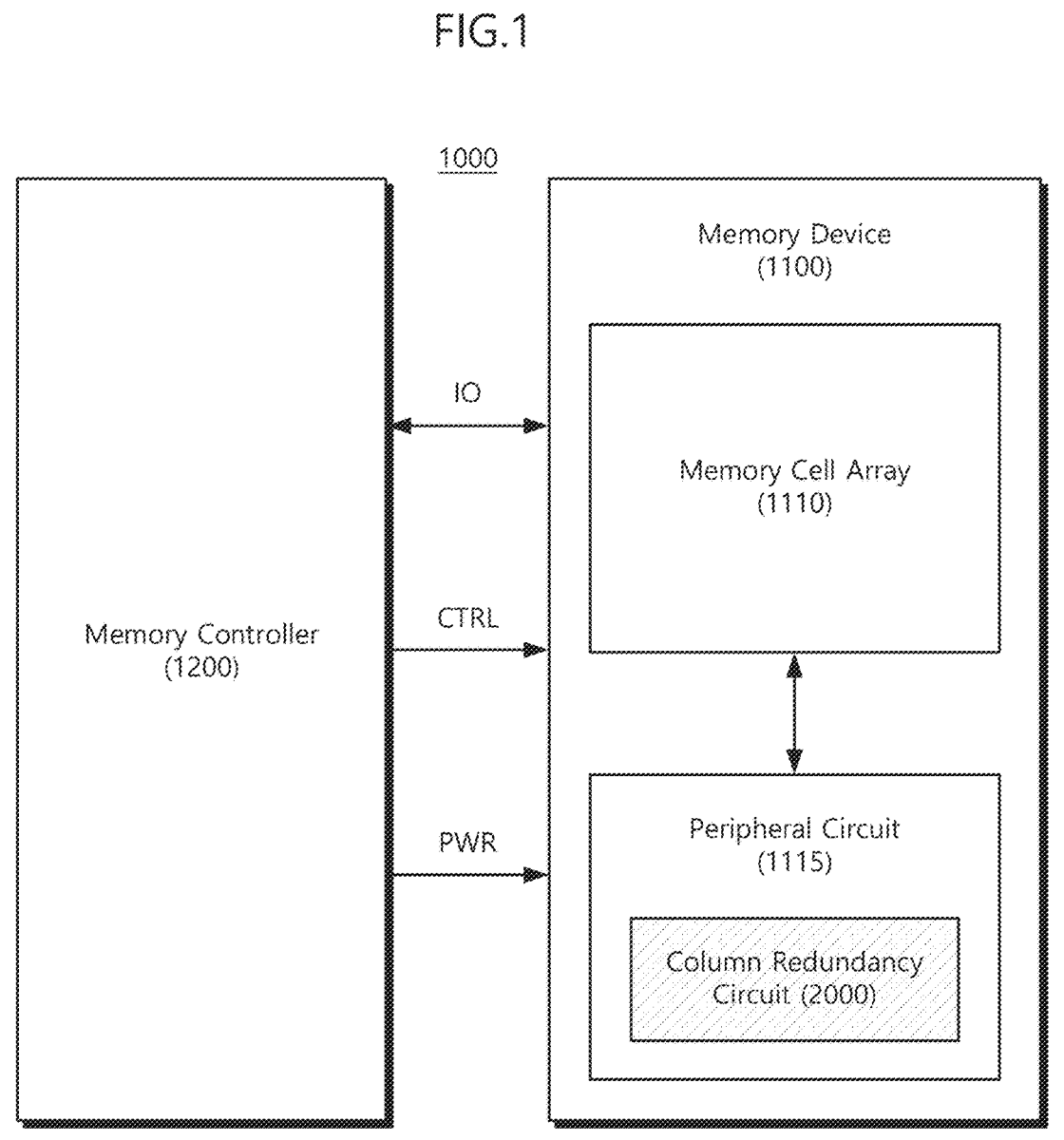

FIG. 1 is a block diagram illustrating an example of a storage device. Referring to FIG. 1, the storage device 1000 may include a memory device 1100 and a memory controller 1200.

The memory device 1100 may receive input/output signals IO from the memory controller 1200 through input/output lines, receive control signals CTRL through control lines, and receive external power supply PWR through power lines. The storage device 1000 may store data in the memory device 1100 under the control of the memory controller 1200.

The memory device 1100 may include a memory cell array 1110 and a peripheral circuit 1115. The memory cell array 1110 may have a vertical 3D structure. The memory cell array 1110 may include a plurality of memory cells. Multi-bit data may be stored in each memory cell.

The memory cell array 1110 may be located (e.g., disposed) next to or above the peripheral circuit 1115 in terms of the design layout structure. A structure in which the memory cell array 1110 is positioned over the peripheral circuit 1115 may be referred to as a cell on peripheral (COP) structure.

The memory cell array 1110 may be manufactured as a chip separate from the peripheral circuit 1115. An upper chip including the memory cell array 1110 and a lower chip including the peripheral circuit 1115 may be connected to each other by a bonding method. Such a structure may be referred to as a chip-to-chip (C2C) structure.

The peripheral circuit 1115 may include analog circuits and/or digital circuits required to store data in the memory cell array 1110 or read data stored in the memory cell array 1110. The peripheral circuit 1115 may receive the external power PWR through power lines and generate internal powers of various levels.

The peripheral circuit 1115 may receive commands, addresses, and/or data from the memory controller 1200 through input/output lines. The peripheral circuit 1115 may store data in the memory cell array 1110 according to the control signals CTRL. Alternatively or additionally, the peripheral circuit 1115 may read data stored in the memory cell array 1110 and provide the read data to the memory controller 1200.

The peripheral circuit 1115 may include a column redundancy circuit 2000. The column redundancy circuit 2000 may receive a lower column address among fault column address (FCA) and perform a first pre-decoding operation, and may receive an upper column address and perform a second pre-decoding operation. The column redundancy circuit 2000 may receive one lower signal and one or more upper signals through first and second pre-decoding operations and perform a main decoding operation. The column redundancy circuit 2000 may perform a column shift operation according to the result of the main decoding operation.

Figure 2:
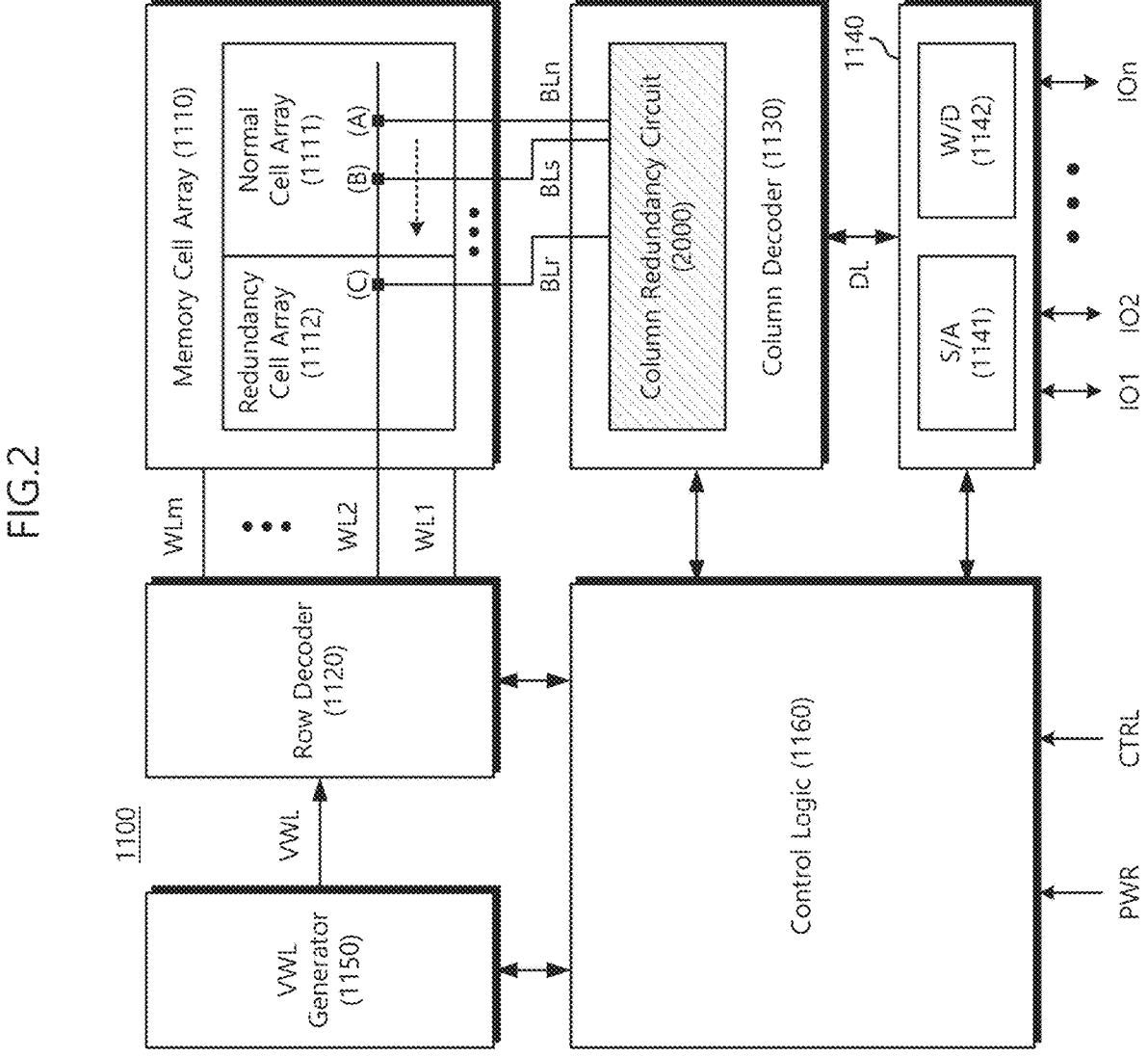
FIG. 2 is an example block diagram illustrating the memory device shown in FIG. 1.

FIG. 2 is an example block diagram illustrating the memory device shown in FIG. 1. Referring to FIG. 2, the memory device 1100 may include a memory cell array 1110 and a peripheral circuit 1115. The peripheral circuit 1115 may include a row decoder 1120, a column decoder 1130, an input/output circuit 1140, a word line voltage generator 1150, and a control logic 1160.

The memory cell array 1110 may include a normal cell array 1111 and a redundancy cell array 1112. The normal cell array 1111 and the redundancy cell array 1112 may include a plurality of memory cells. When a defect occurs in the normal cell array 1111, the redundancy cell array 1112 may repair the defect through a column shift operation.

For example, assume that memory cells (A) to (C) are connected to a word line (e.g., WL2). When a defect occurs in the memory cell (A), the memory cell (A) may be replaced with the memory cell (B) through the column shift operation. The column shift operation may be performed sequentially up to the memory cell (C) in the direction of the dotted arrow.

The row decoder 1120 may be connected to the memory cell array 1110 through a plurality of word lines (WL1 to WLm). The row decoder 1120 may select a word line during a program or read operation. The row decoder 1120 may receive the word line voltage (VWL) from the word line voltage generator 1150 and provide the word line voltage (VWL) for a program or read operation to the selected word line.

The column decoder 1130 may be connected to the memory cell array 1110 through bit lines BLr, BLs, and BLn. Here, BLr may be connected to the redundancy memory cell (C). BLn and BLs may be connected to normal memory cells (A and B), respectively. The column decoder 1130 may select a bit line in response to a selection signal provided from the column redundancy circuit 2000.

The input/output circuit 1140 is internally connected to the column decoder 1130 through data lines DL, and externally connected to the memory controller (see FIG. 1, 1200) through input/output lines (IO1 to IOn). The input/output circuit 1140 may receive program data from the memory controller 1200 during a program operation. The input/output circuit 1140 may provide data read from the memory cell array 1110 to the memory controller 1200 during a read operation.

The input/output circuit 1140 may include a sense amplifier (S/A, 1141) and a write driver (W/D, 1142). The input/output circuit 1140 may input or output data from input/output terminals. The number of input/output terminals may vary depending on the type of the storage device 1000. The input/output circuit 1140 may provide data to the write driver 1142 in response to control signals or output data provided from the sense amplifier 1141 to the outside.

The word line voltage generator 1150 may receive internal power from the control logic 1160 and generate a word line voltage (VWL) required to read or write data. The word line voltage (VWL) may be provided to a selected word line (e.g., WL2) through the row decoder 1120. The word line voltage generator 1150 may include a plurality of word line drivers.

The control logic 1160 may use command CMD, address ADDR, and control signals CTRL provided from the memory controller 1200 to control read and/or write operations of the memory device 1100. Address ADDR may include a row address for selecting one memory block or word line, and a column address for selecting a bit line.

The control logic 1160 may control a column redundancy circuit 2000. The column redundancy circuit 2000 may perform a column shift operation in response to a column redundancy enable signal provided from the control logic 1160. When a defect occurs in a memory cell (A), the column redundancy circuit 2000 may sequentially proceed from the memory cell (A) to the memory cell (C) through the column shift operation. The column redundancy circuit 2000 may perform pre-decoding operations and main decoding operations in various ways to perform the column shift operation.

For example, the column redundancy circuit 2000 may receive a lower column address among the fault column address (FCA) and perform an OH pre-decoding operation, and may receive an upper column address and perform an OH pre-decoding operation. The column redundancy circuit 2000 may receive a lower column address from among the fault column addresses (FCA) and perform a BTC pre-decoding operation, and may receive an upper column address and perform a BTC pre-decoding operation. Alternatively, the column redundancy circuit 2000 may receive a lower column address from among the fault column address (FCA) and perform an OH pre-decoding operation, and may receive an upper column address and perform a BTC pre-decoding operation.

Figure 3:
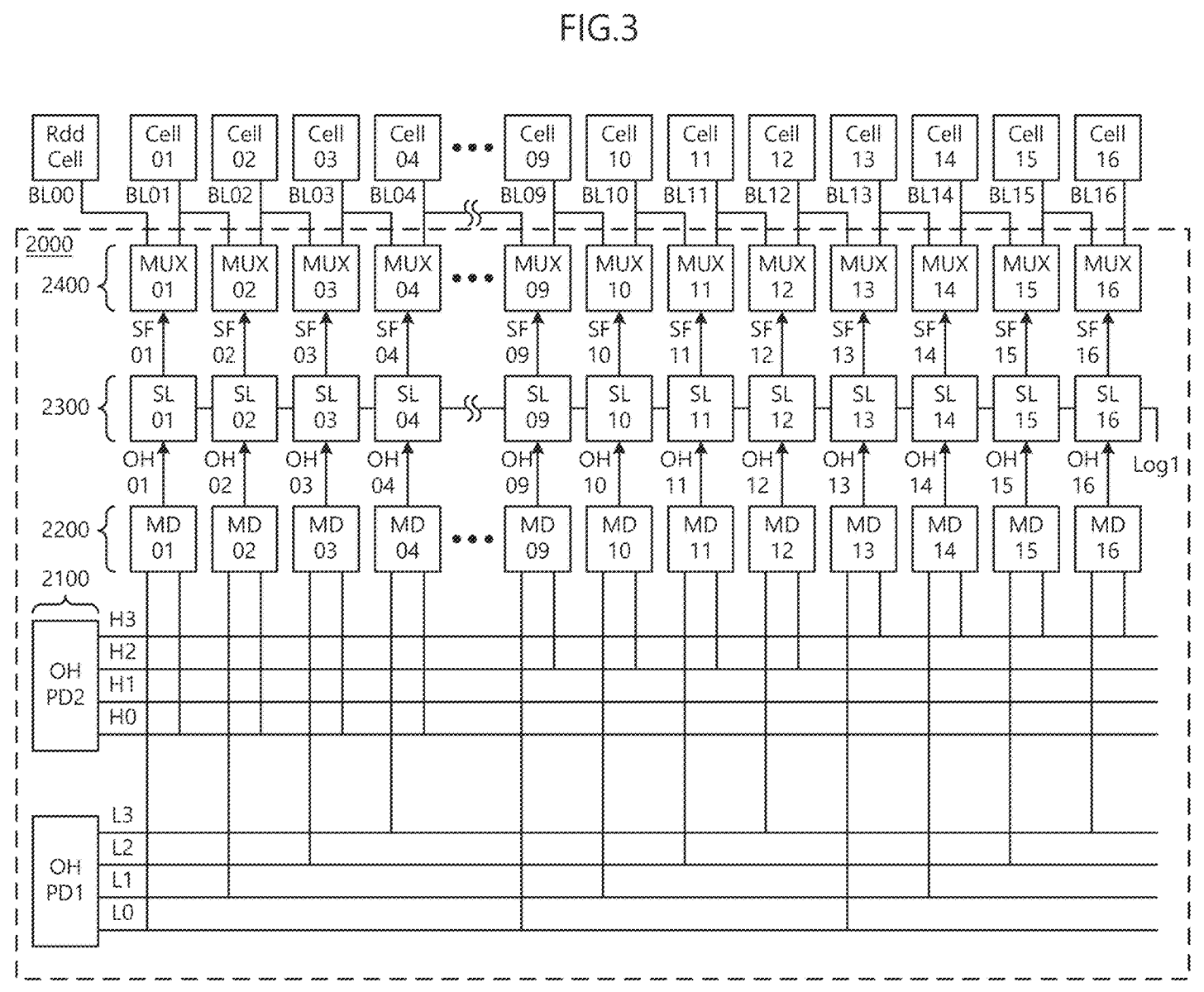

FIG. 3 is a block diagram illustrating an example of the column redundancy circuit shown in FIG. 2. Referring to FIG. 3, the column redundancy circuit 2000 may include a pre-decoder unit 2100, a main decoder unit 2200, a shift logic unit 2300, and a multiplexer unit 2400.

The pre-decoder unit 2100 may include a first OH pre-decoder (OH PD1) and a second OH pre-decoder (OH PD2). The first OH pre-decoder (OH PD1) may activate one lower signal in response to the fault column address (FCA). And the second OH pre-decoder (OH PD2) may activate one upper signal in response to the fault column address (FCA). For example, the first OH pre-decoder (OH PD1) may activate one of L0 to L3, and the second OH pre-decoder (OH PD2) may activate one of H0 to H3.

The main decoder unit 2200 may include first to sixteenth main decoders (MD01 to MD16). Each main decoder may receive one lower signal from the first OH pre-decoder (OH PD1) and one upper signal from the second OH pre-decoder (OH PD2) and generate an OH signal. For example, the first main decoder (MD01) may receive the L0 signal and the H0 signal and generate the first OH signal (OH01).

The shift logic unit 2300 may include first to sixteenth shift logic (SL01 to SL16). Each shift logic may receive an OH signal and generate a shift signal. For example, the first shift logic SL01 may receive the first OH signal OH01 and generate the first shift signal SF01.

The multiplexer unit 2400 may include first to sixteenth multiplexers (MUX01 to MUX16). Each multiplexer may receive a shift signal and perform a shift operation. For example, the first multiplexer (MUX01) may receive the first shift signal (SF01) and select one of the redundancy bit line (BL00) and the first bit line (BL01).

The redundancy bit line BL00 may be connected to a redundancy memory cell (Rdd Cell). The first to sixteenth bit lines (BL01 to BL16) may be connected to the first to sixteenth memory cells (Cell01 to Cell16), respectively.

Figure 4:
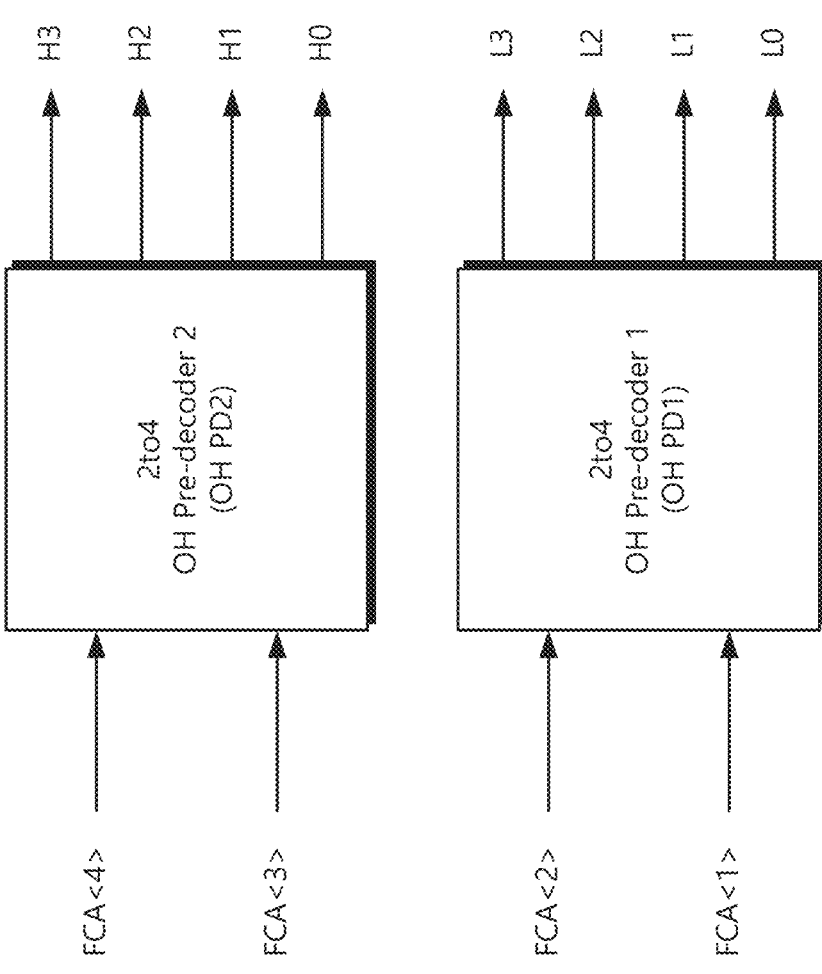

FIGS. 4 to 6 are block diagrams illustrating an example of the pre-decoder unit shown in FIG. 3. Referring to FIGS. 4 and 5, the first and second OH pre-decoders (OH PD1 and OH PD2) may be 2 to 4 OneHot decoders. The 2 o4 OneHot decoder may activate one of the first to fourth output signals in response to the first and second fault column address (FCA).

The first OH pre-decoder (OH PD1) may receive the first and second fault column address (FCA<1>, FCA<2>) and may activate one of the lower signals L0 to L3. If FCA<2:1> is 00, L0 may be activated. If FCA<2:1> is 01, L1 may be activated. If FCA<2:1> is 10, L2 may be activated. And if FCA<2:1> is 11, L3 may be activated.

The second OH pre-decoder (OH PD2) may receive the third and fourth fault column address (FCA<3>, FCA<4>) and may activate one of the upper signals H0 to H3. If FCA<4:3> is 00, H0 may be activated. If FCA<4:3> is 01, H1 may be activated, If FCA<4:3> is 10, H2 may be activated, and if FCA<4:3> is 11, H3 may be activated.

In the example of FIG. 6, assuming that the fault column address (FCA) is 1001, the input of the first OH pre-decoder (OH PD1) may be 01 and the input of the second OH pre-decoder (OH PD2) may be 10. The first OH pre-decoder (OH PD1) may receive 01 as input and activate L1. The second OH pre-decoder (OH PD2) may receive 10 as input and activate H2.

Figure 7:
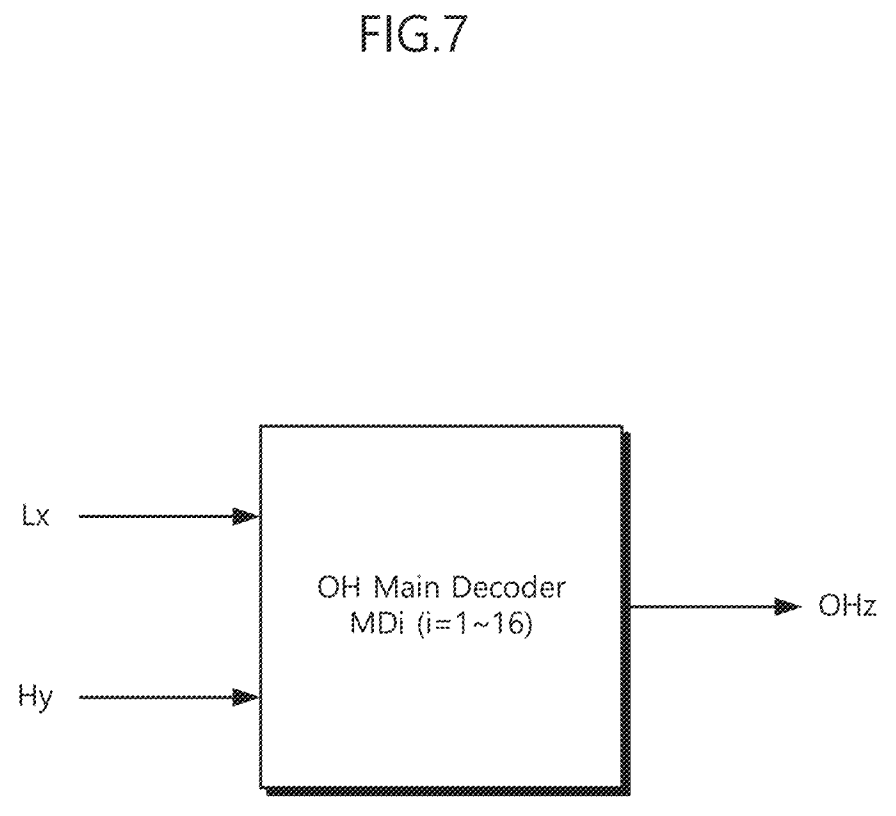

FIGS. 7 to 10 are example block diagrams illustrating the main decoder unit shown in FIG. 3. Referring to FIG. 7, the main decoder may be an OH main decoder. The OH main decoder may activate the OHz signal in response to the Lx signal and Hy signal provided from the pre-decoder unit 2100.

Figure 8:
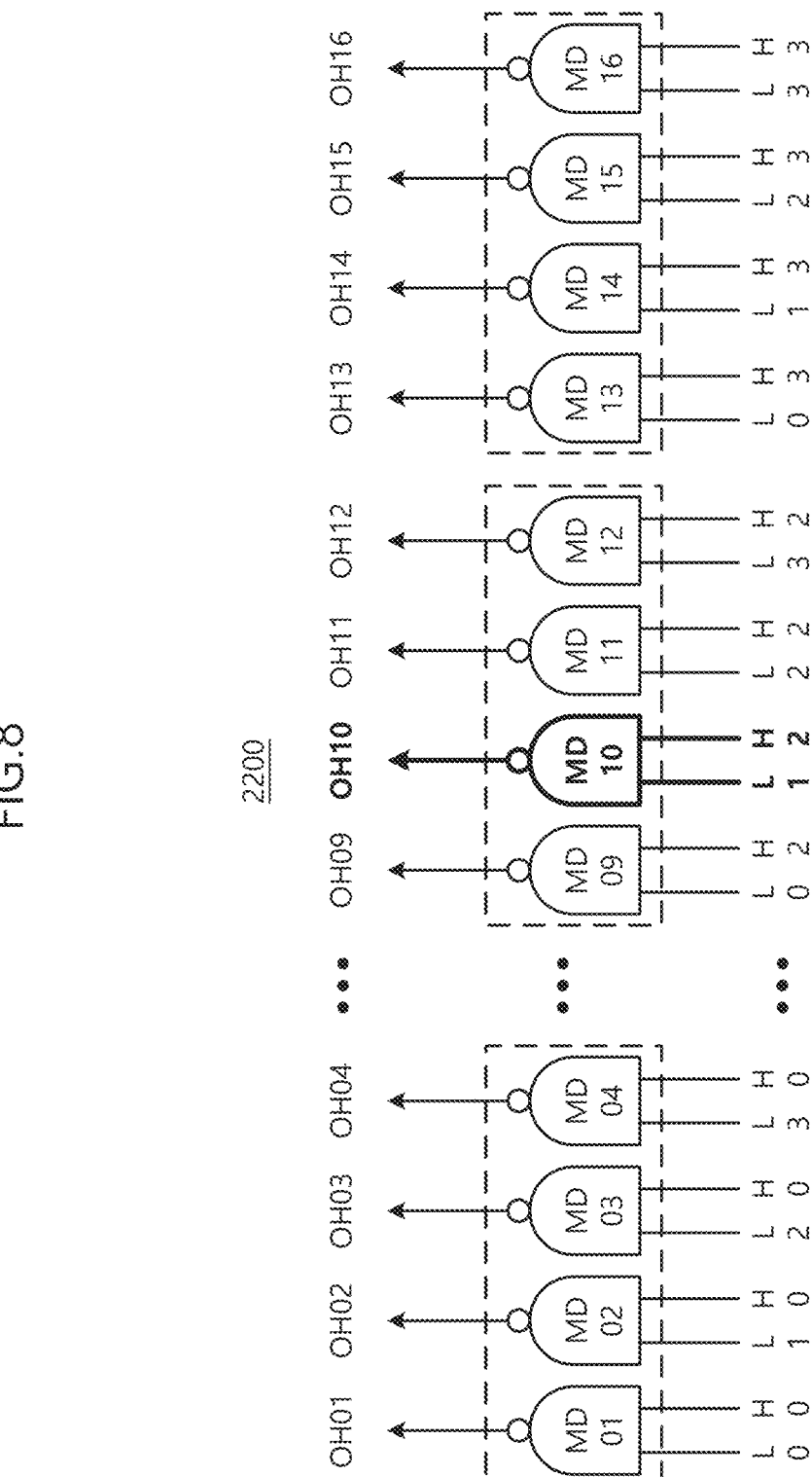

Referring to FIG. 8, the main decoder unit 2200 may include first to sixteenth main decoders (MD01 to MD16). Each main decoder may perform a NAND logic operation and generate an OH signal as a result of the operation. For example, the first main decoder (MD01) may receive the L0 signal and the H0 signal, perform a NAND logic operation, and generate the first OH signal (OH01). The second to sixteenth main decoders (MD02 to MD16) may generate the second to sixteenth OH signals (OH02 to OH16), respectively.

Referring to FIG. 9, the first to sixteenth main decoders (MD01 to MD16) shown in FIG. 8 may receive the Lx signal and the Hy signal and output an OHz signal as a result of the NAND logic operation. If the input of the OH main decoder is 00, the AND logic operation result is 0 and the NAND logic operation result is 1. If the input of the OH main decoder is 01, the AND logic operation result is 0 and the NAND logic operation result is 1. If the input of the OH main decoder is 10, the AND logic operation result is 0 and the NAND logic operation result is 1. If the input of the OH main decoder is 11, the AND logic operation result is 1 and the NAND logic operation result is 0.

Figure 10:
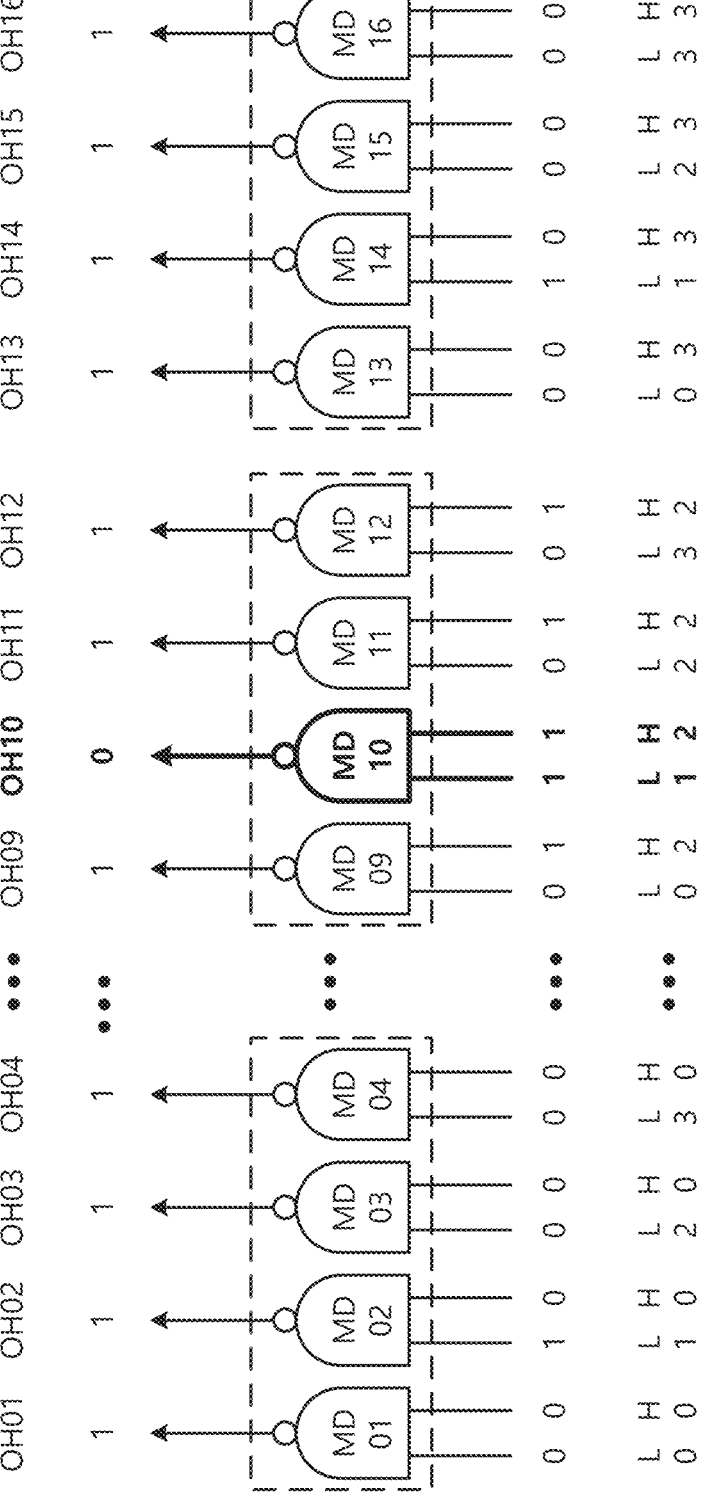

Referring to FIG. 10, the output (OH01 to OH09) of the first to ninth main decoders (MD01 to MD09) is 1. The inputs (L1, H2) of the 10th main decoder (MD10) are 11 and the output (OH10) is 0. The outputs (OH11 to OH16) of the 11th to 16th main decoders (MD11 to MD16) are 1.

Figure 11:
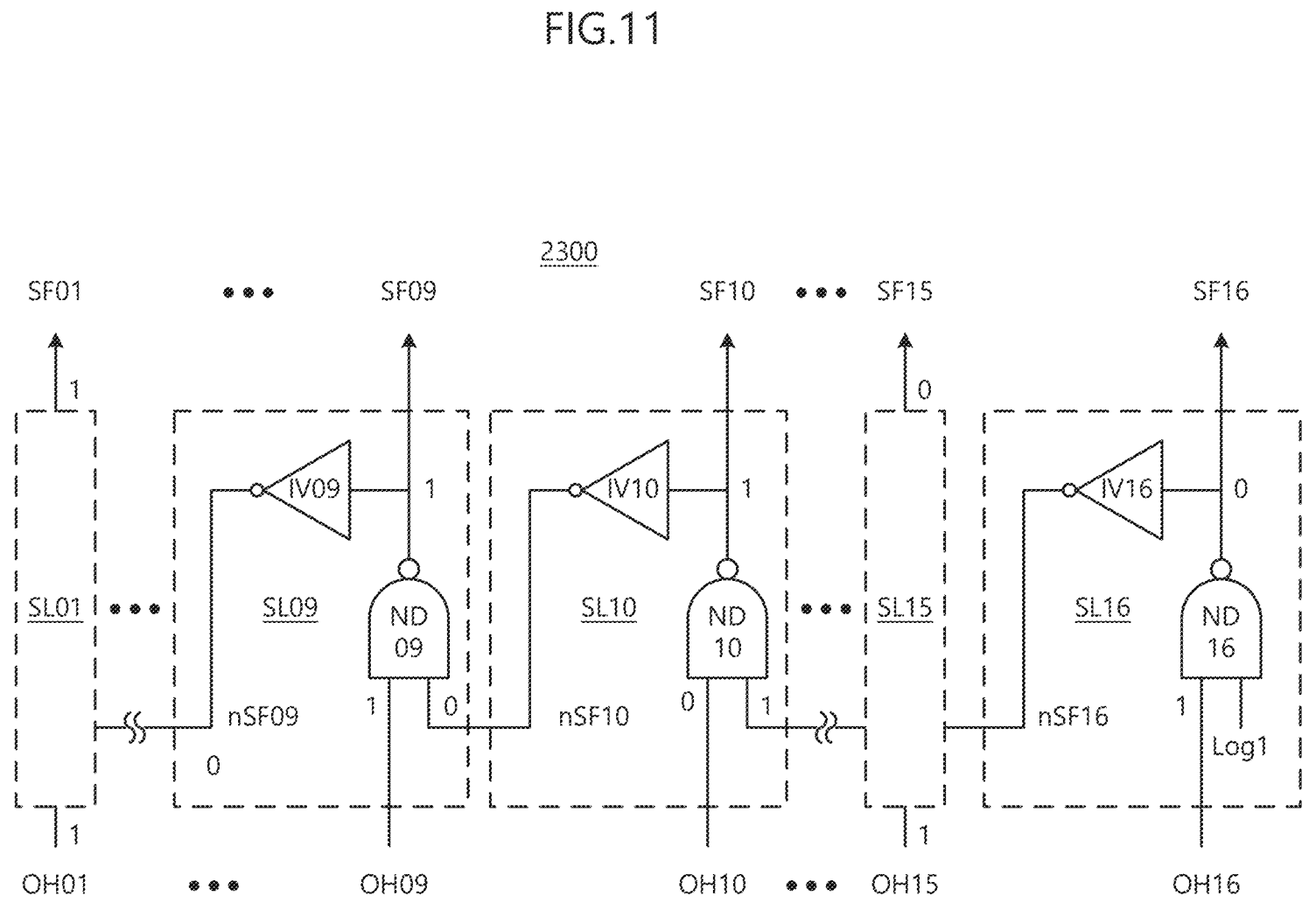

FIG. 11 is a circuit diagram illustrating an example of the shift logic unit shown in FIG. 3. Referring to FIG. 11, the shift logic unit 2300 may include first to sixteenth shift logic (SL01 to SL16). Each shift logic may include a NAND gate and an inverter. Each shift logic may receive an OH signal and generate a shift signal (SL).

For example, the 16th shift logic (SL16) may include a 16th NAND gate (ND16) and a 16th inverter (IV16). The 16th NAND gate (ND16) may receive a Log and the 16th OH signal (OH16) and generate a 16th shift signal (SF16). If the Log is 1 and the 16th OH signal (OH16) is 1, the 16th shift signal (SF16) may be 0. The 16th inverter (IV16) may generate an inverted 16th shift signal (nSF16). nSF16 is 1 and may be provided as the 15th shift logic (SL15).

The 15th shift logic (SL15) may receive OH15 and nSF16, and generate SF15. Since OH15 is 1 and nSF16 is 1, SF15 may be 0 and nSF15 may be 1. The shift signals of the 11th to 14th shift logics (SL11 to SL14) may be 0 and the inverted shift signals may be 1.

The tenth shift logic (SL10) may include a tenth NAND gate (ND10) and a tenth inverter (IV10). The tenth NAND gate (ND10) may receive OH10 and nSF11 as input, and generate SF10. If OH10 is 0 and nSF11 is 1, SF10 may be 1. The tenth inverter (IV10) may generate nSF10. nSF10 is 0 and may be provided to the ninth shift logic (SL09).

The ninth shift logic (SL09) may include a ninth NAND gate (ND09) and a ninth inverter (IV09). The ninth NAND gate (ND9) may receive OH09 and nSF10 and generate SF09. If OH09 is 1 and nSF10 is 0, SF09 may be 1. The ninth inverter (IV09) may generate nSF09. nSF09 is 0 and may be provided to the 8th shift logic (SL8).

The first shift logic (SL01) may receive OH01 and nSF02 and generate SF01. Since OH01 is 1 and nSF02 is 1, SF01 may be 1.

The shift logic unit 2300 may generate shift signals while operating sequentially from SL16 to SL01. When the shift signal is first set to 1, the shift logic unit 2300 may change all subsequent shift signals to 0. Referring to the example of FIG. 11, since the 10th shift signal SF10 is 1, all shift signals occurring after the 10th shift signal may be 1.

Figure 12:
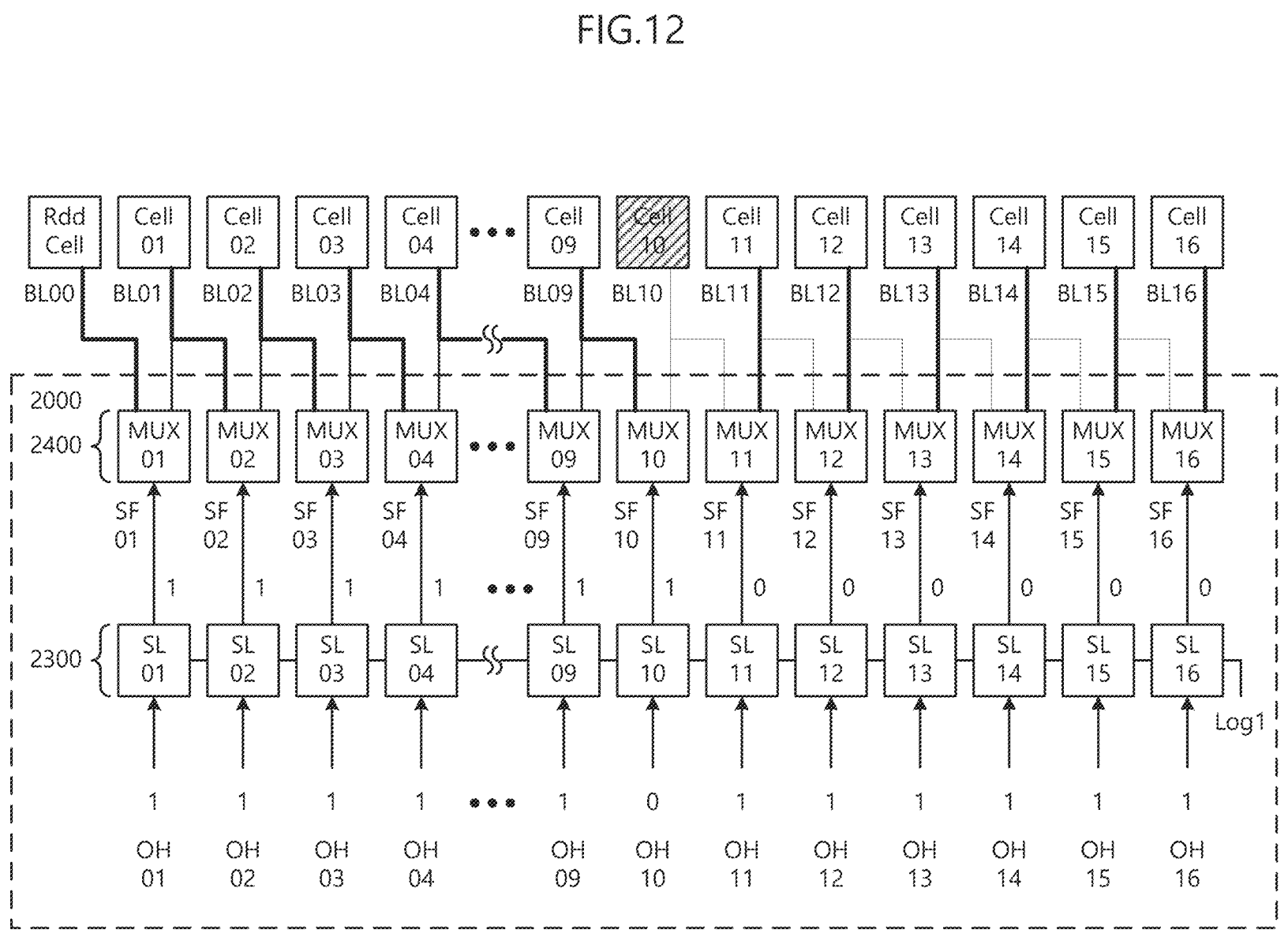

FIG. 12 is a block diagram illustrating an example of the multiplexer unit shown in FIG. 3. The multiplexer unit 2400 may include first to sixteenth multiplexers (MUX01 to MUX16). Each multiplexer may receive a shift signal and perform a column shift operation.

The 16th multiplexer (MUX16) may receive the 16th shift signal (SF16) and select one of the 16th bit line (BL16) and the 15th bit line (BL15). The 16th multiplexer (MUX16) may select the 16th bit line (BL16) because the 16th shift signal (SF16) is 0. The 11th to 15th multiplexers (MUX11 to MUX15) may select the 11th to 15th bit lines (BL11 to BL15), respectively.

The tenth multiplexer (MUX10) may receive the tenth shift signal (SF10) and select one of the tenth bit line (BL10) and the ninth bit line (BL09). The tenth multiplexer (MUX10) may select the ninth bit line (BL09) because the tenth shift signal (SF10) is 1. The second to ninth multiplexers (MUX02 to MUX09) may select the first to eighth bit lines (BL01 to BL08), respectively. And the first multiplexer (MUX01) may select the redundancy bit line (BL00).

The redundancy bit line (BL00) may be connected to the redundancy memory cell (Rdd Cell). The first to sixteenth bit lines (BL01 to BL16) may be connected to the first to sixteenth memory cells (Cell01 to Cell16), respectively. When a fault occurs in the tenth memory cell (Cell10), data to be stored in the tenth memory cell (Cell10) may be stored in the ninth memory cell (Cell09). Data to be stored in the second to ninth memory cells (Cell02 to Cell09) may be stored in the first to eighth memory cells (Cell01 to Cell08), respectively. And data to be stored in the first memory cell (Cell01) may be stored in the redundancy memory cell (Rdd Cell).

Since the column redundancy circuit 2000 shown in FIG. 3 uses an OH pre-decoder and an OH main decoder, the design structure is simple and the metal lines connected to the input and output terminals may be minimized. The column redundancy circuit 2000 shown in FIG. 3 may reduce metal resources and area.

Figure 13:
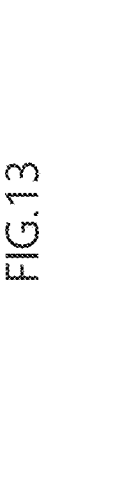
FIG. 13 is a block diagram illustrating an example of the column redundancy circuit shown in FIG. 2.

FIG. 13 is a block diagram illustrating an example of the column redundancy circuit shown in FIG. 2. Referring to FIG. 13, the column redundancy circuit 3000 may include a pre-decoder unit 3100, a main decoder unit 3200, and a multiplexer unit 3400.

The pre-decoder unit 3100 may include a first BTC pre-decoder (BTC PD1) and a second BTC pre-decoder (BTC PD2). Each BTC pre-decoder may activate one or more output signals in response to a fault column address (FCA).

For example, the first BTC pre-decoder (BTC PD1) may activate one or more of L1 to L3. The second BTC pre-decoder (BTC PD2) may activate one or more of H1 to H3. L0 and H0 may be set to a Log 1. H4 may be set to a Log 0. Log values are marked with *, such as *L0, *H0, and *H4.

The main decoder unit 3200 may include first to sixteenth main decoders (MD01 to MD16). Each main decoder may receive one or more lower signals, one or more upper signals, and log values and generate a BT signal. The lower signal may be provided from the first BTC pre-decoder (BTC PD1). The upper signal may be provided from the second BTC pre-decoder (BTC PD2).

The first to fourth main decoders (MD01 to MD04) may receive L0 to L3 signals, respectively. L0 may be set to a Log 1. L1 to L3 may be provided from the first BTC pre-decoder (BTC PD1). The first to fourth main decoders (MD01 to MD04) may all receive H0 and H1 signals. H0 may be set to a Log 1. H1 may be provided from the second BTC pre-decoder (BTC PD2).

The 9th to 12th main decoders (MD09 to MD12) may receive L0 to L3 signals, respectively. The 9th to 12th main decoders (MD09 to MD12) may all receive H2 and H3 signals. H2 and H3 may be provided from the second BTC pre-decoder (BTC PD2).

The 13th to 16th main decoders (MD13 to MD16) may receive L0 to L3 signals, respectively. The 13th to 16th main decoders (MD13 to MD16) may all receive H3 and H4 signals. H3 may be provided from the second BTC pre-decoder (BTC PD2). H4 may be set to a Log 0.

The multiplexer unit 3400 may include first to sixteenth multiplexers (MUX01 to MUX16). Each multiplexer may receive a BT signal and perform a column shift operation. For example, the first multiplexer (MUX01) may receive the first BT signal (BT01) and select one of the redundancy bit line (BL00) and the first bit line (BL01). The redundancy bit line (BL00) may be connected to the redundancy memory cell (Rdd Cell). The first to sixteenth bit lines (BL01 to BL16) may be connected to the first to sixteenth memory cells (Cell01 to Cell16), respectively.

Figure 15:
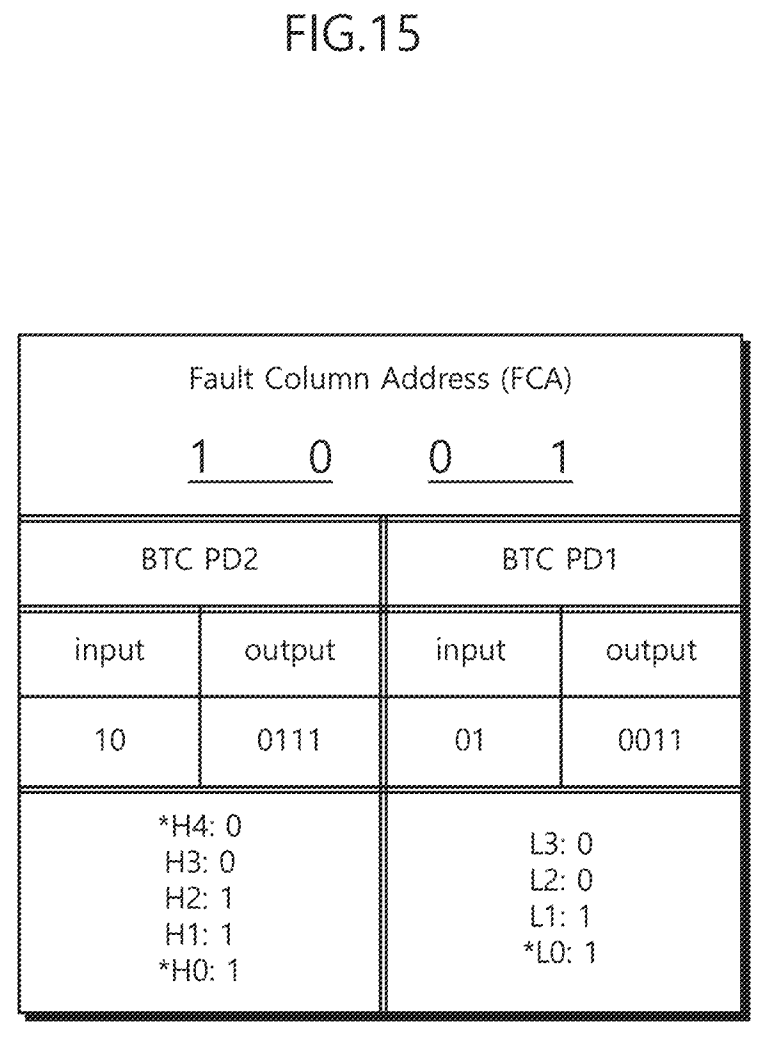

FIGS. 14 and 15 are block diagrams illustrating an example of the pre-decoder unit shown in FIG. 13. Referring to FIGS. 14 and 15, the first and second BTC pre-decoders (BTC PD1 and BTC PD2) may be BTC (Binary to Thermometer) decoders. The BTC decoder may activate one or more of the first to fourth output signals in response to the first and second fault column address (FCA).

The first BTC pre-decoder (BTC PD1) may receive the fault column address (FCA), activate the Log value L0, and activate one or more of L1 to L3. If the FCA is 00, L0 may be activated. If the FCA is 01, L0 and L1 may be activated. If the FCA is 10, L0 to L2 may be activated. And if the FCA 11, L0 to L3 may be activated.

The second BTC pre-decoder (BTC PD2) may receive the fault column address, activate the log value H0, and deactivate the log value H4. The second BTC pre-decoder (BTC PD2) may activate one or more of H1 to H3. If FCA is 00, H0 may be activated. If the FCA is 01, H0 and H1 may be activated. If the FCA is 10, H0 to H2 may be activated. And if the FCA is 11, H0 to H3 may be activated.

In the example of FIG. 15, assuming that the fault column address (FCA) is 1001, the input of the first BTC pre-decoder (BTC PD1) may be 01 and the input of the second BTC pre-decoder (BTC PD2) may be 10. The first BTC pre-decoder (BTC PD1) may receive 01 as input and activate L0 and L1. L0 is the Log 1, and L1 is 1. L2 and L3 are 0.

The second BTC pre-decoder (BTC PD2) may receive 10 as input and may activate H0 to H2. H0 is the Log 1, and H1 and H2 are 1. H3 is 0, and H4 is the Log 0.

Figure 16:
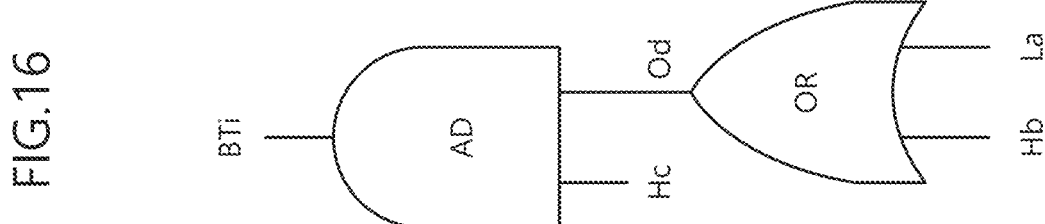
FIGS. 16 and 17 are example circuit diagrams for explaining the main decoder unit shown in FIG. 13.
Figure 17:
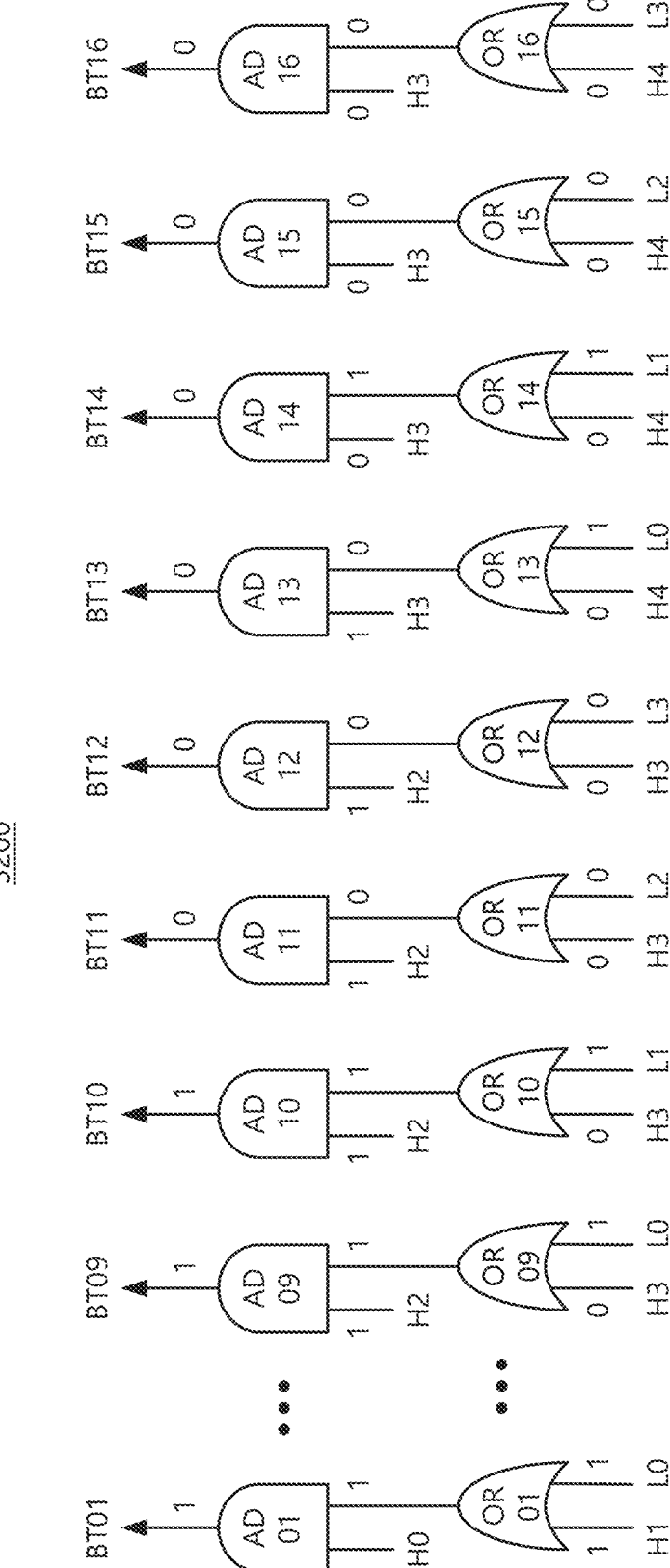

FIGS. 16 and 17 are example circuit diagrams for explaining the main decoder unit shown in FIG. 13. FIG. 16 illustrates an example of the BTC decoder. FIG. 17 illustrates an example of the main decoder unit shown in FIG. 13.

Referring to FIG. 16, the BTC decoder may activate the BTi signal in response to the La, Hb, and Hc signals. La may be provided from the first BTC pre-decoder (BTC PD1). Hb and Hc may be provided from the second BTC pre-decoder (BTC PD2). As an example, b=c+1. The BTC decoder may perform OR logic operation and AND logic operation.

For example, the BTC decoder may include an OR gate (OR) and an AND gate (AD). The OR gate may receive La and Hb as input, perform OR logic operation, and output Od. The AND gate may receive Hc and Od as input, perform AND logic operation, and output the BTi signal.

Referring to FIG. 17, the main decoder unit 3200 may include a plurality of BTC decoders. Referring to FIG. 17, the main decoder unit 3200 may include first to sixteenth BTC decoders. Each BTC decoder may include an OR gate and an AND gate. Each BTC decoder may receive La, Ha, and Hb as input and output BTi.

The first BTC decoder may include a first OR gate (OR01) and a first AND gate (AD01). The first OR gate (OR01) may receive L0 and H1 as input, and the first AND gate (AD01) may receive the output of the first OR gate (OR01) and H0 as input. Since L0 is 1 and H1 is 1, the first OR gate (OR01) may output 1. Since H0 is 1, the first AND gate (AD01) may output 1. Therefore, the first BT signal (BT01) may be 1.

The second to sixteenth BTC decoders may include second to sixteenth OR gates (OR02 to OR16) and second to sixteenth AND gates (AD02 to AD16), respectively. The second to sixteenth BTC decoders may receive La, Ha, and Hb as input and output the second to sixteenth BT signals (BT02 to BT16). The 1st to 10th BT signals (BT01 to BT10) may be 1, and the 11th to 16th BT signals (BT11 to BT16) may be 0.

Figure 18:
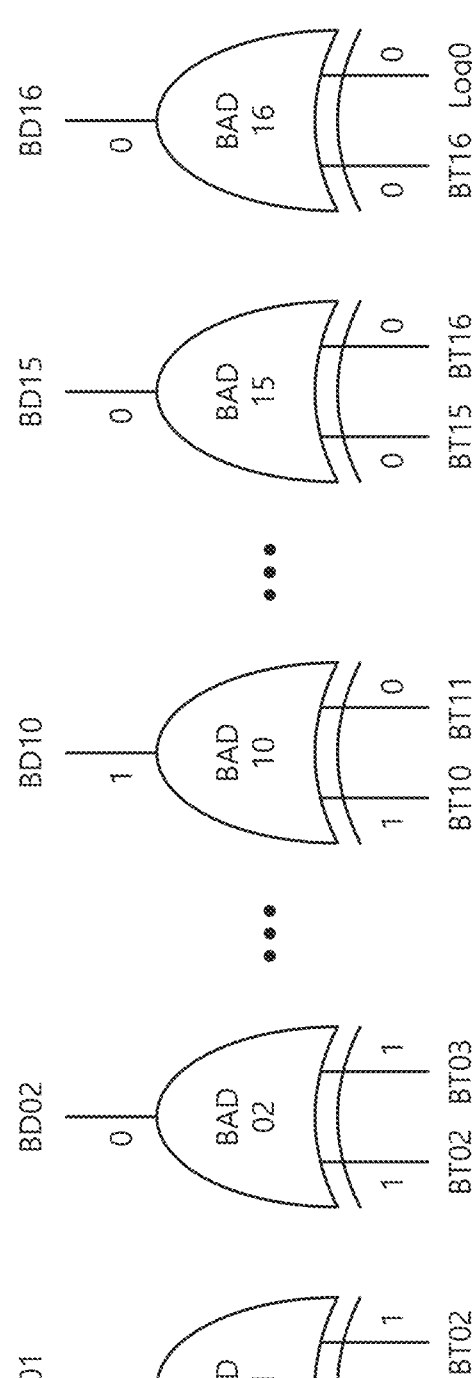
FIG. 18 is a circuit diagram illustrating an example of a bad cell detection unit of the column redundancy circuit shown in FIG. 13.

FIG. 18 is a circuit diagram illustrating an example of a bad cell detection unit of the column redundancy circuit shown in FIG. 13. Referring to FIG. 18, the column redundancy circuit 3000 may further include a bad cell detection unit 3500 to find a column of a bad cell.

The bad cell detection unit 3500 may include first to sixteenth bad cell detectors BAD01 to BAD16. The bad cell detection unit 3500 may find the column position of the bad cell by performing an XOR logic operation on neighboring BT signals. The XOR logic operation may output 0 if the inputs are the same value and output 1 if the inputs are different values. In the above example, the tenth bad cell detector BAD10 may perform an XOR logic operation on BT10 and BT11 and output 1. Therefore, the bad cell may be the 10th memory cell (Cell10).

Figure 19:
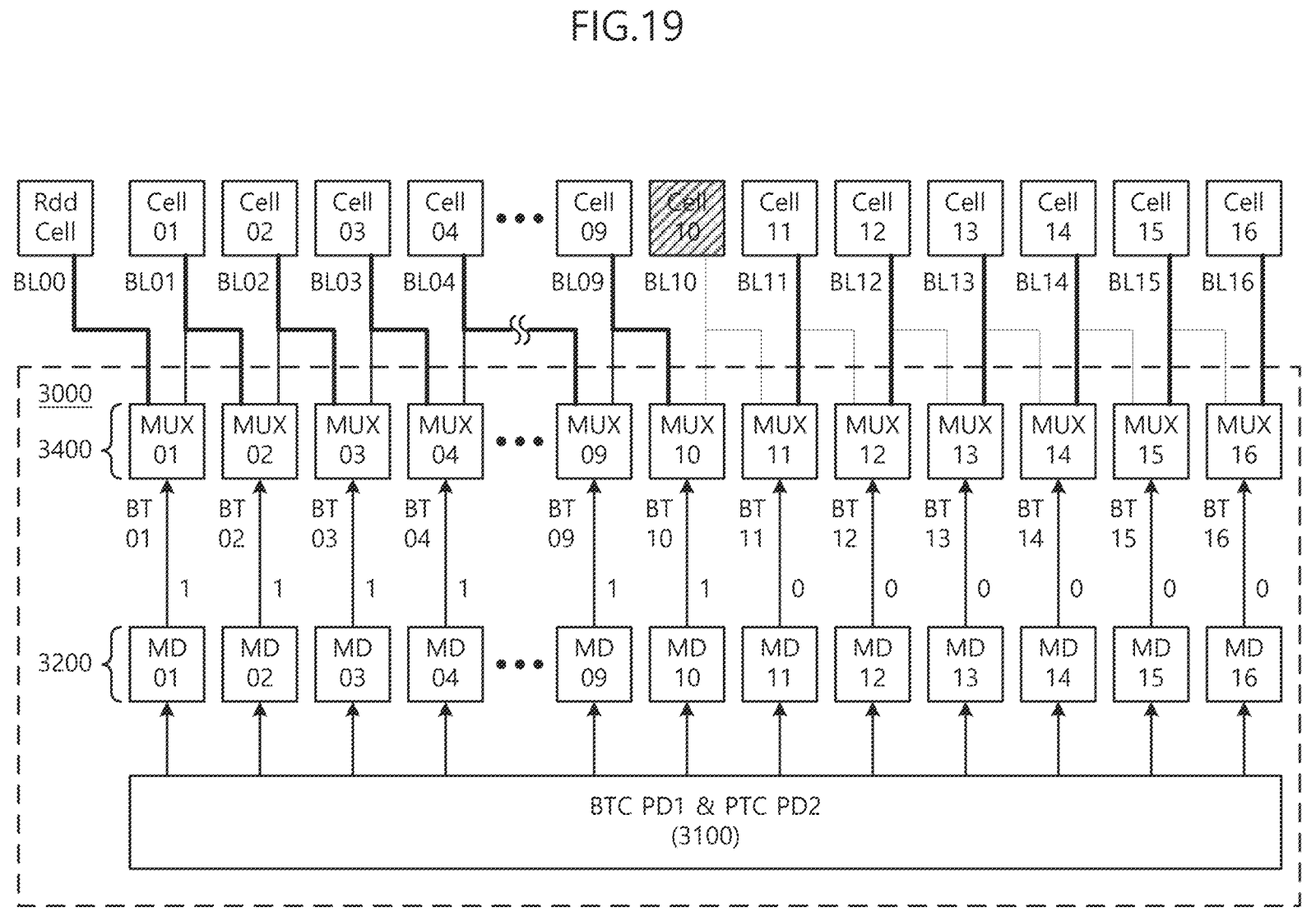

FIG. 19 is a block diagram illustrating an example of the multiplexer unit shown in FIG. 13. The multiplexer unit 3400 may include first to sixteenth multiplexers (MUX01 to MUX16). Each multiplexer may receive a BT signal and perform a shift operation.

The 16th multiplexer (MUX16) may receive the 16th BT signal (BT16) and select one of the 16th bit line (BL16) and the 15th bit line (BL15). The 16th multiplexer (MUX16) may select the 16th bit line (BL16) because the 16th BT signal (BT16) is 0. The 11th to 16th multiplexers (MUX11 to MUX15) may select the 11th to 15th bit lines (BL11 to BL15), respectively.

The tenth multiplexer (MUX10) may receive the tenth BT signal (BT10) and select one of the tenth bit line (BL10) and the ninth bit line (BL09). The tenth multiplexer (MUX10) may select the ninth bit line (BL09) because the tenth BT signal (BT16) is 1. The second to ninth multiplexers (MUX02 to MUX09) may select the first to eighth bit lines (BL01 to BL08), respectively. And the first multiplexer (MUX01) may select the redundancy bit line (BL00).

The redundancy bit line (BL00) may be connected to the redundancy memory cell (Rdd Cell). The first to sixteenth bit lines (BL01 to BL16) may be connected to the first to sixteenth memory cells (Cell01 to Cell16), respectively. When the tenth memory cell (Cell10) is a bad cell, data to be stored in the tenth memory cell (Cell10) may be stored in the ninth memory cell (Cell09). Data to be stored in the second to ninth memory cells (Cell02 to Cell09) may be stored in the first to eighth memory cells (Cell01 to Cell08), respectively. And data to be stored in the first memory cell (Cell01) may be stored in the redundancy memory cell (Rdd Cell).

The column redundancy circuit 3000 shown in FIG. 13 may reduce the setup time required for a column shift operation because the BT signal is simultaneously provided to the multiplexer unit 3400.

Figure 20:
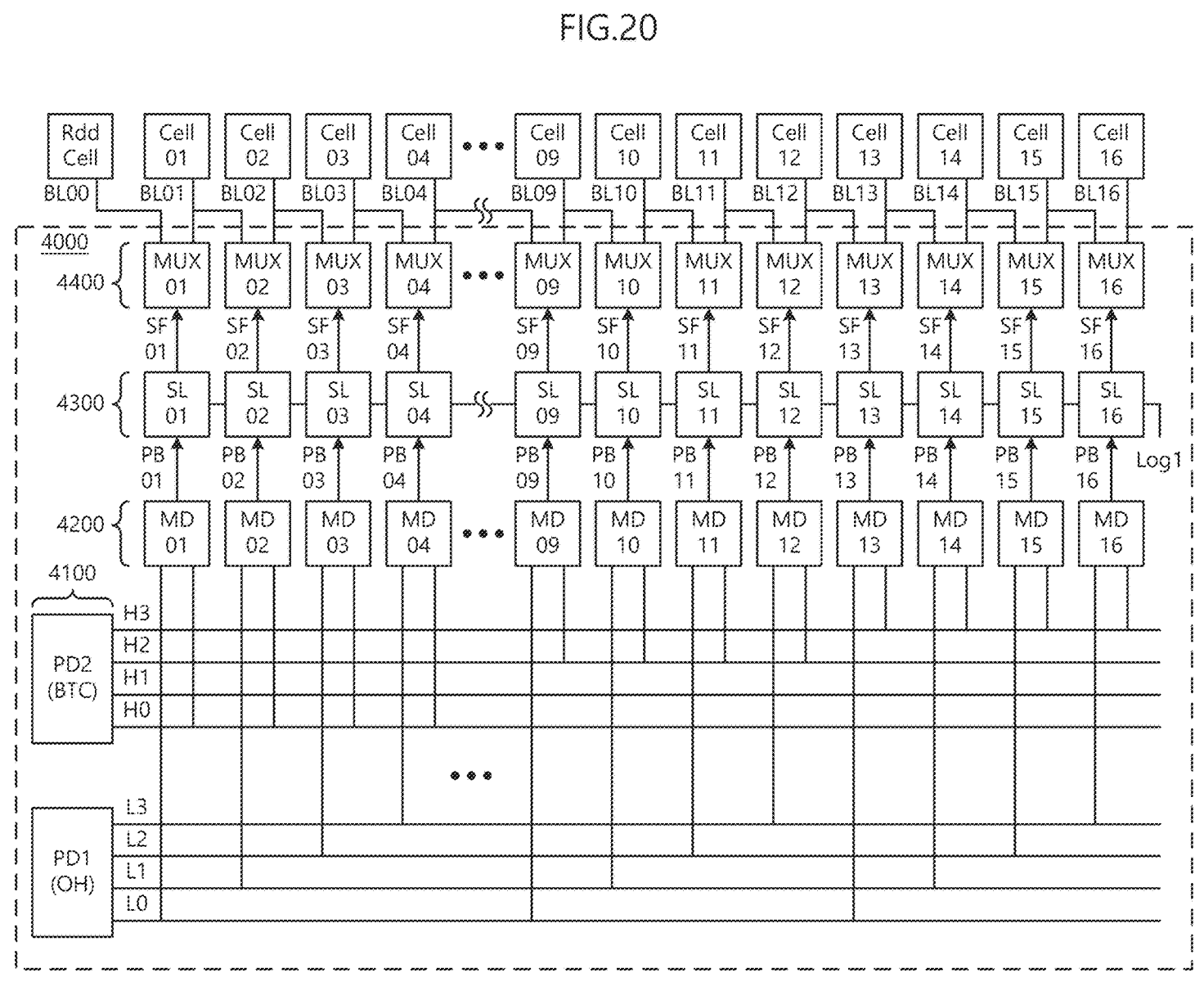

FIG. 20 is a block diagram illustrating another example of the column redundancy circuit shown in FIG. 2. Referring to FIG. 20, the column redundancy circuit 4000 may include a pre-decoder unit 4100, a main decoder unit 4200, a shift logic unit 4300, and a multiplexer unit 4400.

The pre-decoder unit 4100 may include a first pre-decoder (OH PD1) and a second pre-decoder (BTC PD2). The first pre-decoder (OH PD1) may activate one output signal in response to the fault column address (FCA). For example, the first pre-decoder (OH PD1) may activate one of L0 to L3. The second pre-decoder (BTC PD2) may activate one or more output signals in response to the fault column address (FCA). For example, the second pre-decoder (BTC PD2) may activate one or more of H0 to H3.

The main decoder unit 4200 may include first to sixteenth main decoders (MD01 to MD16). Each main decoder may receive one lower signal from the first pre-decoder (OH PD1) and one or more upper signals from the second pre-decoder (BTC PD2) and generate a PB signal. For example, the first main decoder (MD01) may receive the L0 signal and the H0 signal and generate the first PB signal (PB01).

The shift logic unit 4300 may include first to sixteenth shift logic (SL01 to SL16). Each shift logic may receive a PB signal and generate a shift signal. For example, the first shift logic SL01 may receive the first PB signal PB01 and generate the first shift signal SF01.

The multiplexer unit 4400 may include first to sixteenth multiplexers (MUX01 to MUX16). Each multiplexer may receive a shift signal and perform a shift operation. For example, the first multiplexer (MUX01) may receive the first shift signal (SF01) and select one of the redundancy bit line (BL00) and the first bit line (BL01).

Figure 22:
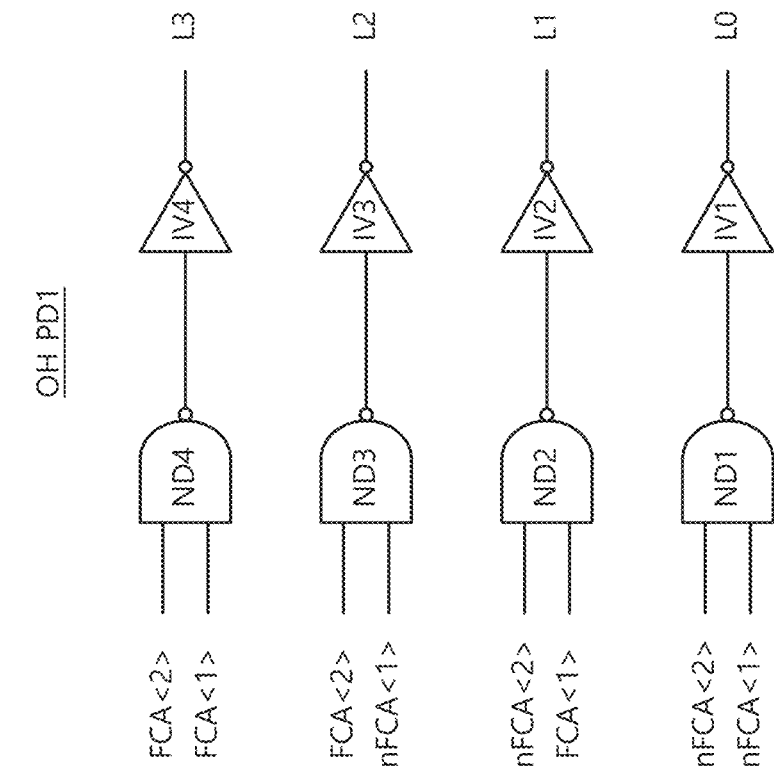

FIGS. 21 to 24 are block diagrams illustrating an example of the pre-decoder unit shown in FIG. 20. Referring to FIGS. 21 and 22, the first pre-decoder (OH PD1) may be a 2 to 4 OneHot decoder. The 2 to 4 OneHot decoder may activate one of the first to fourth output signals in response to the first and second fault column address (FCA).

The first pre-decoder (OH PD1) may receive the first fault column address (FCA<1>) and the second fault column address (FCA<2>), and may activate one of L0 to L3. If FCA<2:1> is 00, L0 may be activated, if it is 01, L1 may be activated, if it is 10, L2 may be activated, and if it is 11, L3 may be activated.

The first pre-decoder (OH PD1) may include first to fourth NAND gates (ND1 to ND4) and first to fourth inverters (IV1 to IV4). The first NAND gate ND1 may receive nFCA<1> and nFCA<2> and provide the NAND operation result to the first inverter IV1. The first inverter (IV1) may output L0. Here, nFCA<1> is inverted FCA<1>, and nFCA<2> is inverted FCA<2>.

The second NAND gate ND2 may receive FCA<1> and nFCA<2>, and the second inverter IV2 may output L1. The third NAND gate ND3 may receive nFCA<1> and FCA<2>, and the third inverter IV3 may output L2. The fourth NAND gate ND4 may receive FCA<1> and FCA<2>, and the fourth inverter IV4 may output L3.

Figure 23:
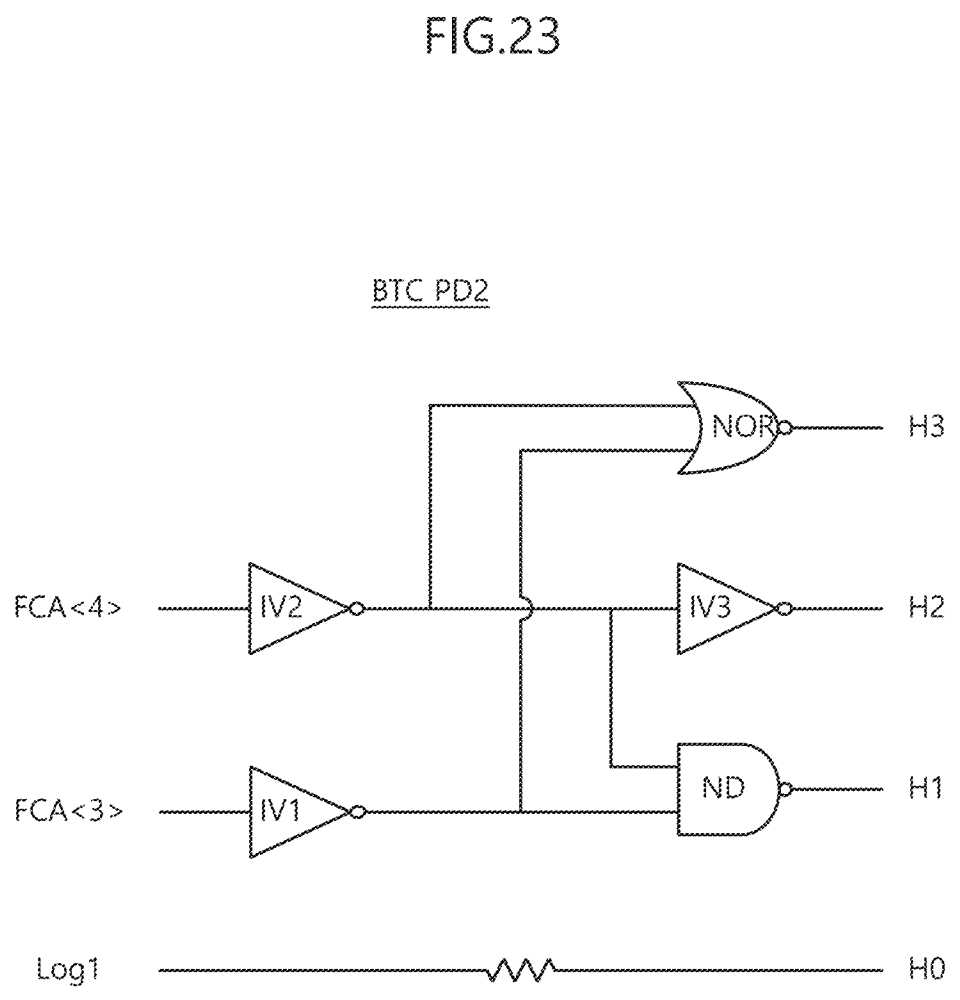

Referring to FIGS. 21 and 23, the second pre-decoder (BTC PD2) may receive the third fault column address (FCA<3>) and the fourth fault column address (FCA<4>), and activate one or more of H0~H3. If FCA<4:3> is 00, H0 may be activated, if it is 01, H0 and H1 may be activated, if it is 10, H0 to H2 may be activated, and if it is 11, H0 to H3 may be activated.

The second pre-decoder (BTC PD2) may include a NAND gate (ND), first to third inverters (IV1 to IV3), and a NOR gate (NOR). H0 may be set to a Log 1. The first inverter IV1 may receive the third fault column address FCA<3> and provide nFCA<3> to the NAND gate ND. The second inverter (IV2) may receive the fourth fault column address (FCA<4>) and provide nFCA<4> to the NAND gate (ND), the third inverter (IV3), and the NOR gate (NOR).

The NAND gate (ND) may receive nFCA<3> and nFCA<4> as input, perform NAND logic operation, and output H1. The third inverter (IV3) may receive nFCA<4> as input and output H2. The NOR gate (NOR) may receive nFCA<3> and nFCA<4>, perform NOR logic operation, and output H3.

In the example of FIG. 24, assuming that the fault column address (FCA) is 1001, the input of the first pre-decoder (OH PD1) may be 01 and the input of the second pre-decoder (BTC PD2) may be 10. The first pre-decoder (OH PD1) may receive 01 as input and activate L1. The second pre-decoder (BTC PD2) receives 10 as input and may activate H0 to H2.

Figure 25:
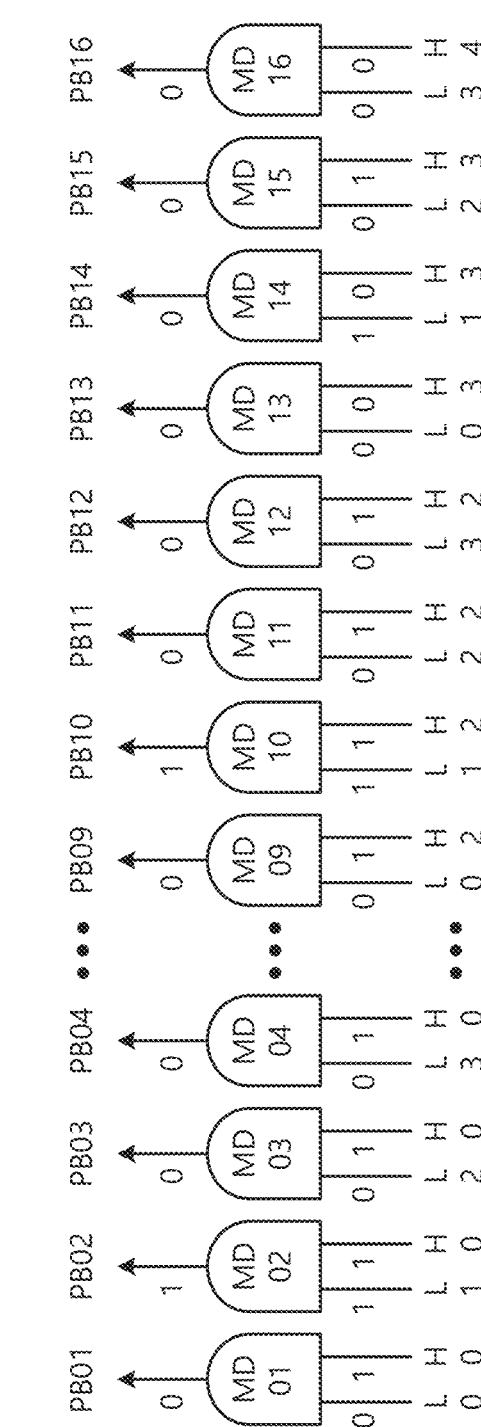
FIG. 25 is a circuit diagram illustrating an example of the main decoder unit shown in FIG. 20.

FIG. 25 is a circuit diagram illustrating an example of the main decoder unit shown in FIG. 20. Referring to FIG. 25, the main decoder unit 4200 may include first to sixteenth main decoders (MD01 to MD16). Each main decoder may perform an AND logic operation and generate a PB signal as a result of the operation.

For example, the first main decoder MD01 may receive the L0 signal and the H0 signal, perform AND logic operation, and generate the first PB signal PB01. Since L0 is 0 and H0 is 1, PB01 may be 0. The second main decoder (MD02) may receive the L1 signal and the H0 signal and generate the second PB signal (PB02). Since L1 is 1 and H0 is 1, PB02 may be 1. The 3rd to 16th main decoders (MD03 to MD16) may generate the 3rd to 16th PB signals (PB03 to PB16), respectively.

Figure 26:
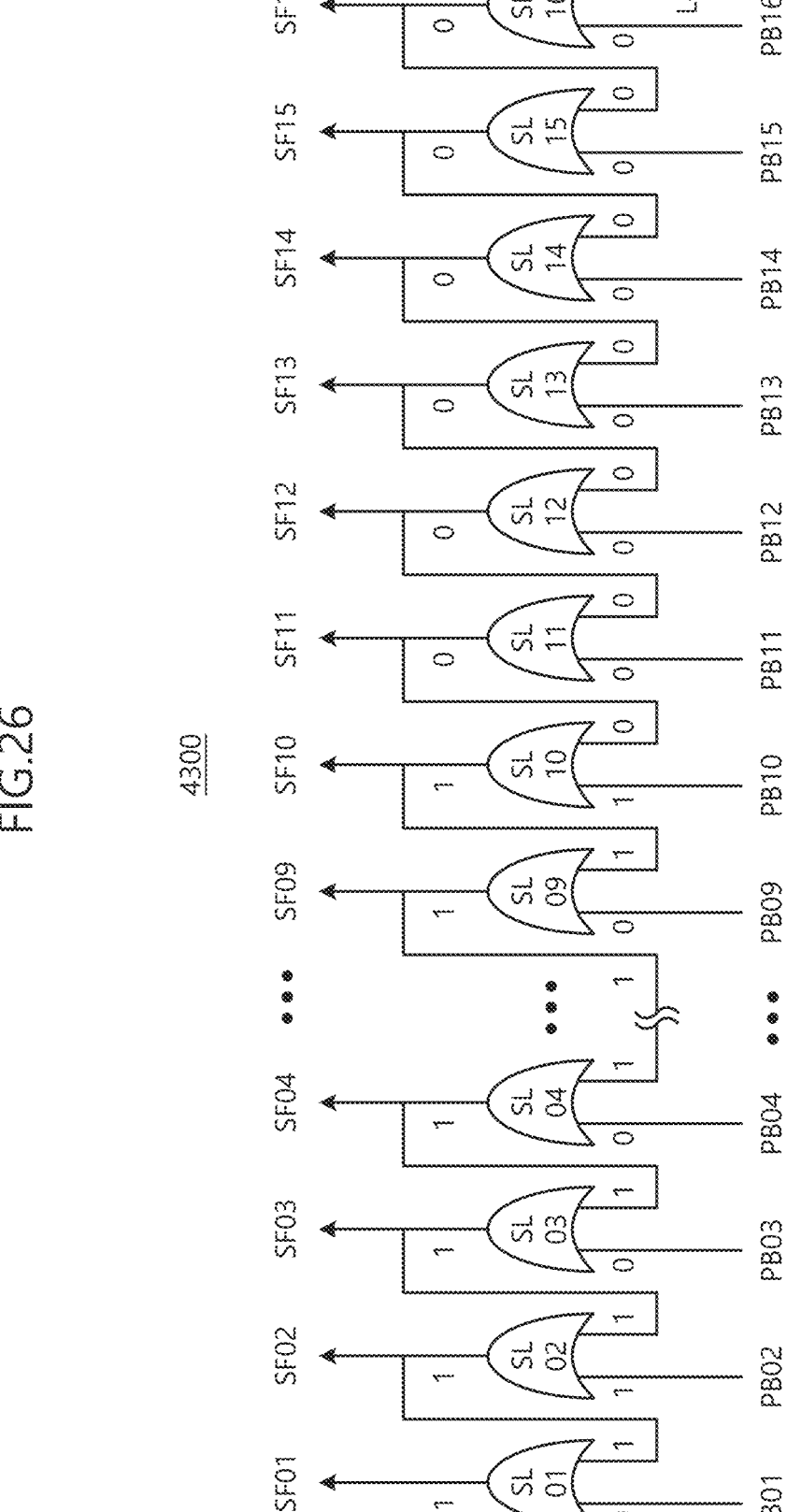
FIG. 26 is a circuit diagram illustrating an example of the shift logic unit shown in FIG. 20.

FIG. 26 is a circuit diagram illustrating an example of the shift logic unit shown in FIG. 20. Referring to FIG. 26, the shift logic unit 4300 may include first to sixteenth shift logic (SL01 to SL16). Each shift logic may perform an OR logic operation and generate a shift signal.

For example, the 16th shift logic (SL16) may be implemented as an OR gate. The 16th shift logic (SL16) may receive log values 0 and PB16 and generate SF16. If the log value is 0 and PB16 is 0, SF16 may be 0. The 15th shift logic (SL15) may receive PB15 and SF16 as input and generate SF15. Since PB15 is 0 and SF16 is 0, SF15 may be 0. The shift signals of the 11th to 14th shift logics (SL11 to SL14) may be 0.

The 10th shift logic (SL10) may receive PB10 and SF11 as input and generate SF10. Since PB10 is 1 and SF11 is 0, SF10 may be 1. The 9th shift logic (SL09) may receive inputs of PB09 and SF10 and generate SF09. Since PB09 is 0 and SF10 is 1, SF09 may be 1. The first to eighth shift signals (SF01 to SF08) of the first to eighth shift logic (SL01 to SL08) may be 1.

The shift logic unit 4300 may generate a shift signal while operating sequentially from SL16 to SL01. When the shift signal is set to 1 for the first time, the shift logic unit 4300 may change all subsequent shift signals to 1. Referring to the example of FIG. 26, since the 10th shift signal SF10 is 1, all shift signals occurring after the 10th shift signal may be 1.

Figure 27:
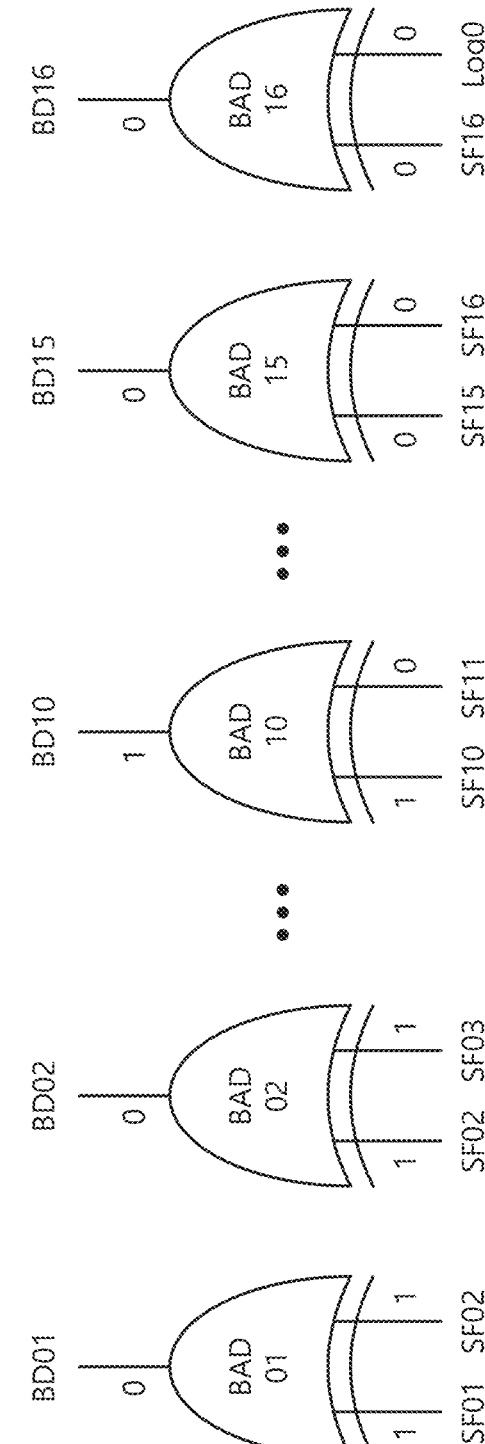
FIG. 27 is a circuit diagram illustrating an example of a bad cell detection unit of the column redundancy circuit shown in FIG. 20.

FIG. 27 is a circuit diagram illustrating an example of a bad cell detection unit of the column redundancy circuit shown in FIG. 20. Referring to FIG. 27, the column redundancy circuit 4000 may further include a bad cell detection unit 4500 to find a column of a bad cell.

The bad cell detection unit 4500 may include first to sixteenth bad cell detectors BAD01 to BAD16. The bad cell detection unit 4500 may find the column position of the bad cell by performing an XOR logic operation on neighboring SF signals. In the above example, the tenth bad cell detector BAD10 may perform an XOR logic operation on SF10 and SF11 and output 1. Therefore, the bad cell may be the tenth memory cell (Cell10).

Figure 28:
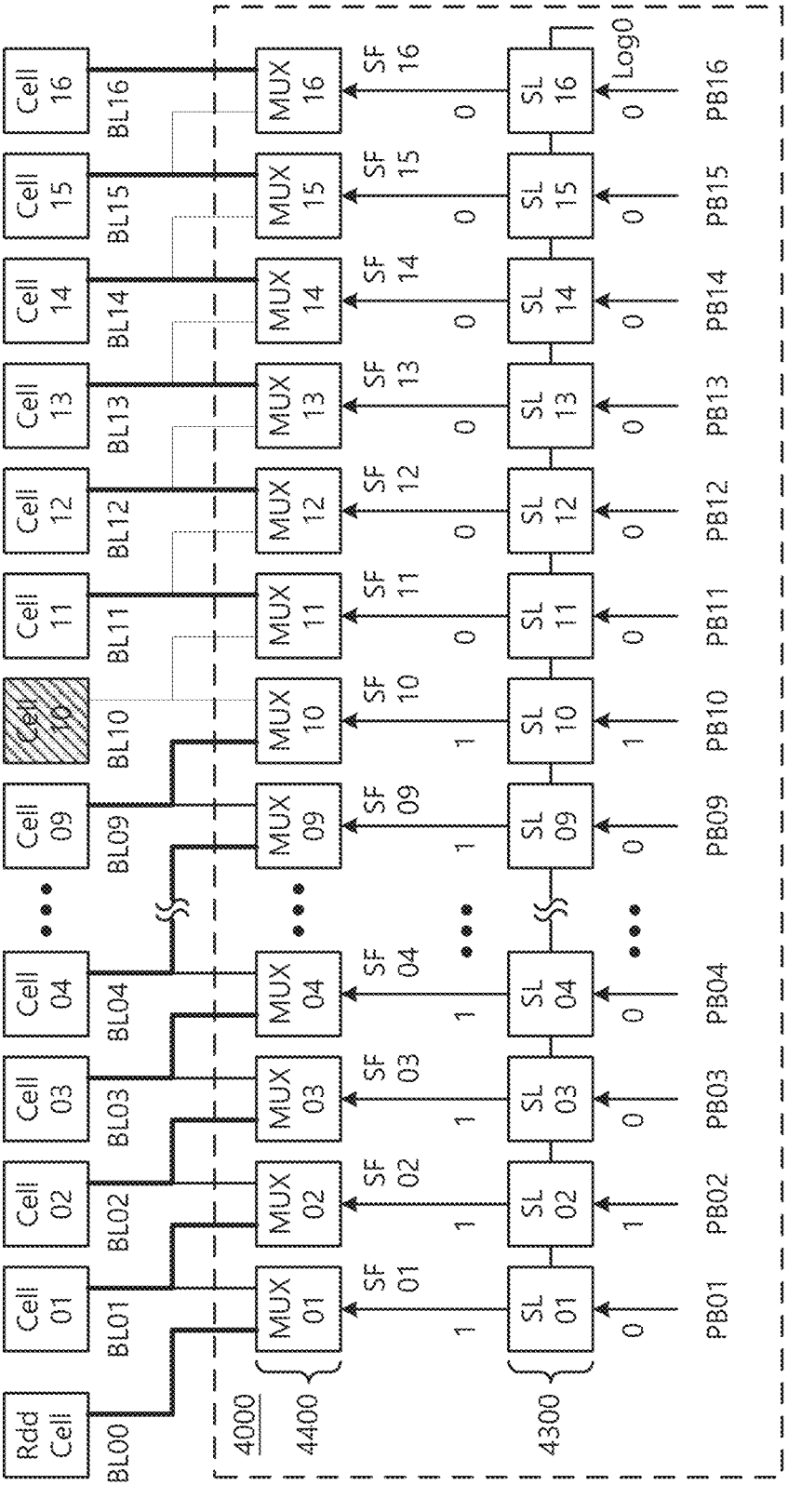
FIG. 28 is a block diagram illustrating an example of the multiplexer unit shown in FIG. 20.

FIG. 28 is a block diagram illustrating an example of the multiplexer unit shown in FIG. 20. The multiplexer unit 4400 may include first to sixteenth multiplexers (MUX01 to MUX16). Each multiplexer may receive a shift signal and perform a shift operation.

The 16th multiplexer (MUX16) may receive the 16th shift signal (SF16) and select one of the 16th bit line (BL16) and the 15th bit line (BL15). The 16th multiplexer (MUX16) may select the 16th bit line (BL16) because the 16th shift signal (SF16) is 0. The 11th to 16th multiplexers (MUX11 to MUX15) may select the 11th to 15th bit lines (BL11 to BL15), respectively.

The tenth multiplexer (MUX10) may receive the tenth shift signal (SF10) and select one of the tenth bit line (BL10) and the ninth bit line (BL09). The tenth multiplexer (MUX10) may select the ninth bit line (BL09) because the tenth shift signal (SF10) is 1. The second to ninth multiplexers (MUX02 to MUX09) may select the first to eighth bit lines (BL01 to BL08), respectively. And the first multiplexer (MUX01) may select the redundancy bit line (BL00).

The redundancy bit line (BL00) may be connected to the redundancy memory cell (Rdd Cell). The first to sixteenth bit lines (BL01 to BL16) may be connected to the first to sixteenth memory cells (Cell01 to Cell16), respectively. When a fault occurs in the tenth memory cell (Cell10), data to be stored in the tenth memory cell (Cell10) may be stored in the ninth memory cell (Cell09). Data to be stored in the second to ninth memory cells (Cell02 to Cell09) may be stored in the first to eighth memory cells (Cell01 to Cell08), respectively. And data to be stored in the first memory cell (Cell01) may be stored in the redundancy memory cell (Rdd Cell).

The column redundancy circuit 4000 shown in FIG. 20 may reduce metal resources and area by using an OH pre-decoder and a BTC pre-decoder, and may reduce the setup time required for a column shift operation.

The memory device according to example implementations of the present disclosure may reduce the area of the column redundancy circuit. Additionally, according to the present disclosure, the time it takes to perform a column redundancy operation may be reduced.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the present disclosure has been described with reference to implementations thereof, it will be apparent to those of ordinary skill in the art that various changes and modifications may be made thereto without departing from the spirit and scope of the present disclosure as set forth in the following claims.

What is claimed is:

1. A column redundancy circuit of a memory device, the column redundancy circuit comprising:
   a pre-decoder circuit configured to
      receive a lower column address from a plurality of fault column addresses,
      perform a first decoding operation,
      receive an upper column address from the plurality of fault column addresses, and perform a second decoding operation;
   a main decoder circuit including a plurality of main decoders, each main decoder of the plurality of main decoders configured to
      receive a lower signal and an upper signal from the pre-decoder circuit, and
      perform a main decoding operation; and
   a shift logic circuit including a plurality of shift logics, each shift logic of the plurality of shift logics configured to generate a shift signal that enables a column shift operation based on a result of the main decoding operation.

2. The column redundancy circuit of claim 1, wherein the second decoding operation includes a Binary to Thermometer code (BTC) decoding operation.

3. The column redundancy circuit of claim 2, wherein the first decoding operation includes a OneHot (OH) decoding operation.

4. The column redundancy circuit of claim 3, comprising:
   a multiplexer circuit including a plurality of multiplexers, each multiplexer of the plurality of multiplexers configured to
      receive a shift signal from the shift logic circuit, and perform a column shift operation based on selecting a bit line of a plurality of bit lines.

5. The column redundancy circuit of claim 4, wherein the pre-decoder circuit includes:
   a first pre-decoder configured to
      receive the lower column address, and
      activate the lower signal; and
   a second pre-decoder configured to
      receive the upper column address, and
      activate the upper signal.

6. The column redundancy circuit of claim 5, wherein each main decoder of the plurality of main decoders is configured to
      receive the lower signal and the upper signal, and
      perform an AND logic operation.

7. The column redundancy circuit of claim 6, wherein each shift logic of the plurality of shift logics is configured to
      receive a result of the AND logic operation and an output of an adjacent shift logic, and
      perform an OR logic operation.

8. The column redundancy circuit of claim 5, wherein the shift logic circuit is configured to perform a logical operation that changes 0 following 1 to 1 during the main decoding operation.

9. The column redundancy circuit of claim 8, wherein a bad cell is detected at a column position at which 0 appearing after 1 is changed to 1 based on the main decoder circuit performing the main decoding operation.

10. The column redundancy circuit of claim 8, comprising:
   a bad cell detection circuit configured to detect a position of a bad cell based on performing an XOR logic operation on a first shift signal and a second shift signal from the shift logic circuit.

11. A column redundancy circuit of a memory device, the column redundancy circuit comprising:
   a first pre-decoder configured to
      receive a lower column address from a plurality of fault column addresses, and
      perform a OneHot (OH) decoding operation;
   a second pre-decoder configured to
      receive an upper column address from the plurality of fault column addresses, and
      perform a Binary to Thermometer Code (BTC) decoding operation;
   a main decoder configured to
      receive a lower signal from the first pre-decoder,
      receive an upper signal from the second pre-decoder, and
      perform a main decoding operation;
   a shift logic configured to generate a shift signal that enables a column shift operation based on a result of the main decoding operation; and
   a multiplexer configured to
      receive the shift signal, and
      perform the column shift operation based on selecting a bit line of a plurality of bit lines.

12. The column redundancy circuit of claim 11, wherein the main decoder is configured to
      receive the lower signal and the upper signal, and
      perform an AND logic operation.

13. The column redundancy circuit of claim 12, wherein the shift logic is configured to
      receive a result of the AND logic operation and an output of an adjacent shift logic, and perform an OR logic operation.

14. The column redundancy circuit of claim 11, wherein the shift logic is configured to perform a logical operation that changes 0 following 1 to 1 during the main decoding operation.

15. The column redundancy circuit of claim 14, wherein a bad cell is detected at a column position at which 0 appearing after 1 is changed to 1 based on the main decoder performing the main decoding operation.

16. A memory device comprising:

a memory cell array including a redundancy cell array and a normal cell array; and a column redundancy circuit connected to the memory cell array through a plurality of bit lines, the column redundancy circuit configured to control access to a memory cell of the redundancy cell array through a column shift operation based on a defect occurring in a memory cell of the normal cell array, wherein the column redundancy circuit includes, a pre-decoder circuit configured to receive a lower column address from a plurality of fault column addresses, perform a first decoding operation, receive an upper column address from the plurality of fault column addresses, and perform a second decoding operation;

a main decoder circuit including a plurality of main decoders, each main decoder of the plurality of main decoders configured to receive a lower signal and an upper signal from the pre-decoder circuit, and perform a main decoding operation; and a shift logic circuit including a plurality of shift logics, each shift logic of the plurality of shift logics configured to generate a shift signal that enables the column shift operation based on a result of the main decoding operation.

17. The memory device of claim 16, wherein the column redundancy circuit includes a multiplexer circuit, the multiplexer circuit includes a plurality of multiplexers, and each multiplexer of the plurality of multiplexers is configured to receive a shift signal from the shift logic circuit, and perform the column shift operation based on selecting a bit line of the plurality of bit lines.

18. The memory device of claim 17, wherein the second decoding operation includes a Binary to Thermometer Code (BTC) decoding operation.

19. The memory device of claim 18, wherein the first decoding operation includes a OneHot (OH) decoding operation.

20. The memory device of claim 16, wherein the shift logic circuit is configured to perform a logical operation that changes 0 following 1 to 1 during the main decoding operation.

\* \* \* \* \*